(12) United States Patent
Basker et al.

(10) Patent No.: US 10,607,890 B2
(45) Date of Patent: Mar. 31, 2020

(54) SELECTIVE REMOVAL OF SEMICONDUCTOR FINS

(71) Applicant: TESSERA, INC., San Jose, CA (US)

(72) Inventors: Veeraraghavan S. Basker, Schenectady, NY (US); Kangguo Cheng, Schenectady, NY (US); Ali Khakifirooz, Los Altos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 15/450,829

(22) Filed: Mar. 6, 2017

(65) Prior Publication Data

US 2017/0178960 A1    Jun. 22, 2017

Related U.S. Application Data

(62) Division of application No. 14/325,547, filed on Jul. 8, 2014, now Pat. No. 9,613,954.

(51) Int. Cl.
*H01L 21/8234* (2006.01)
*H01L 27/088* (2006.01)
(Continued)

(52) U.S. Cl.
CPC .. *H01L 21/823412* (2013.01); *H01L 21/0273* (2013.01); *H01L 21/26586* (2013.01); *H01L 21/3083* (2013.01); *H01L 21/30604* (2013.01); *H01L 21/30612* (2013.01); *H01L 21/31111* (2013.01); *H01L 21/32* (2013.01); *H01L 21/32134* (2013.01); *H01L 21/76224* (2013.01); *H01L 21/823431* (2013.01); *H01L 21/823481* (2013.01); *H01L 27/0886* (2013.01); *H01L 29/0653* (2013.01); *H01L 29/42364* (2013.01);
(Continued)

(58) Field of Classification Search
None
See application file for complete search history.

(56) References Cited

U.S. PATENT DOCUMENTS 6,794,256 B1 * 9/2004 Fuselier .......... H01L 21/823425
257/E21.411
8,003,466 B2    8/2011 Shi et al.
(Continued)

OTHER PUBLICATIONS

List of IBM Patents or Patent Applications Treated as Related, dated Mar. 6, 2017, 2 pages.

*Primary Examiner* — Erik T. K. Peterson

(57) ABSTRACT

An array of semiconductor fins is formed on a top surface of a substrate. A dielectric material liner is formed on the surfaces of the array of semiconductor fins. A photoresist layer is applied and patterned such that sidewalls of an opening in the photoresist layer are parallel to the lengthwise direction of the semiconductor fins, and are asymmetrically laterally offset from a lengthwise direction passing through the center of mass of a semiconductor fin to be subsequently removed. An angled ion implantation is performed to convert a top portion of dielectric material liner into a compound material portion. The compound material portion is removed selective to the remaining dielectric material liner, and the physically exposed semiconductor fin can be removed by an etch or converted into a dielectric material portion by a conversion process. The dielectric material liner can be removed after removal of the semiconductor fin.

13 Claims, 28 Drawing Sheets

(51) Int. Cl.
*H01L 21/762* (2006.01)
*H01L 21/306* (2006.01)
*H01L 29/66* (2006.01)
*H01L 21/308* (2006.01)
*H01L 21/311* (2006.01)
*H01L 21/32* (2006.01)
*H01L 21/3213* (2006.01)
*H01L 21/027* (2006.01)
*H01L 29/78* (2006.01)
*H01L 21/3115* (2006.01)
*H01L 21/3215* (2006.01)
*H01L 29/06* (2006.01)
*H01L 29/423* (2006.01)
*H01L 21/265* (2006.01)

(52) U.S. Cl.
CPC .... *H01L 29/6681* (2013.01); *H01L 29/66795* (2013.01); *H01L 29/785* (2013.01); *H01L 21/31155* (2013.01); *H01L 21/3215* (2013.01)

(56) References Cited

U.S. PATENT DOCUMENTS

| | | |
|---|---|---|
| 8,664,060 B2 | 3/2014 | Liu et al. |
| 8,703,557 B1 | 4/2014 | Cai et al. |
| 9,184,292 B2 | 11/2015 | Lin et al. |
| 9,553,025 B2 | 1/2017 | Warn et al. |
| 2006/0175667 A1 | 8/2006 | Tsuchiaki |
| 2007/0004117 A1 | 1/2007 | Yagishita |
| 2007/0296014 A1 | 12/2007 | Nakajima |
| 2009/0159936 A1* | 6/2009 | Shah ................. H01L 21/31155 257/288 |
| 2010/0078736 A1* | 4/2010 | Hoentschel ..... H01L 21/823425 257/408 |
| 2010/0167475 A1 | 7/2010 | Nara |
| 2012/0061762 A1* | 3/2012 | Cheng ................. H01L 21/2633 257/365 |
| 2013/0270627 A1* | 10/2013 | Cheng ............ H01L 21/823431 257/326 |
| 2014/0077229 A1 | 3/2014 | Liu et al. |
| 2014/0099792 A1* | 4/2014 | Bergendahl ......... H01L 21/3086 438/696 |
| 2014/0138773 A1* | 5/2014 | Cheng ................. H01L 21/3086 257/347 |
| 2014/0145247 A1* | 5/2014 | Cheng ............... H01L 29/66545 257/288 |
| 2014/0145248 A1* | 5/2014 | Cheng ............... H01L 21/02227 257/288 |
| 2015/0179769 A1* | 6/2015 | He .................... H01L 29/66795 257/632 |
| 2015/0236018 A1 | 8/2015 | Kanakasabapathy |
| 2015/0340272 A1 | 11/2015 | Chen et al. |

* cited by examiner

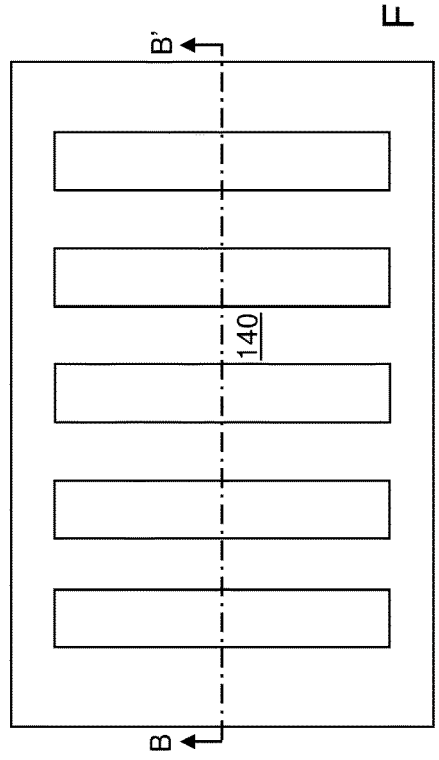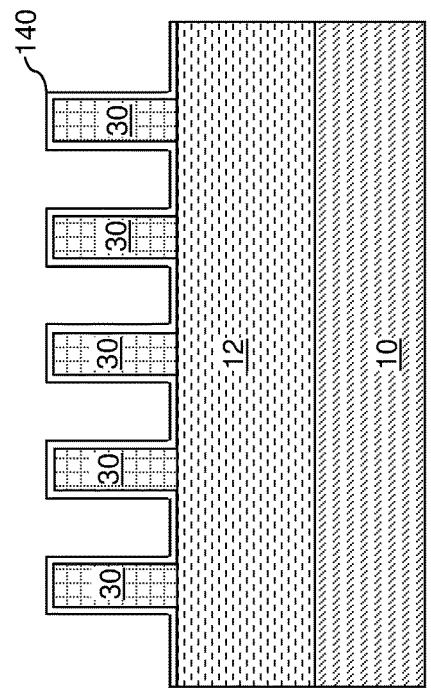

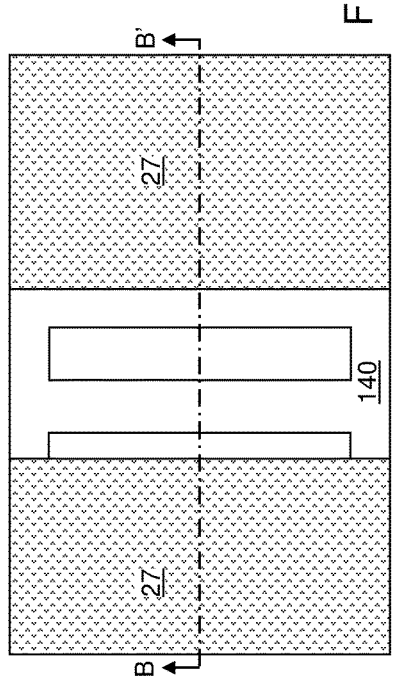
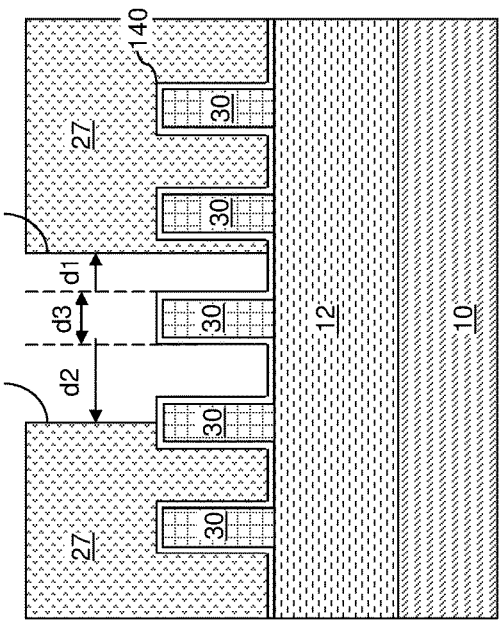
FIG. 3A
FIG. 3B

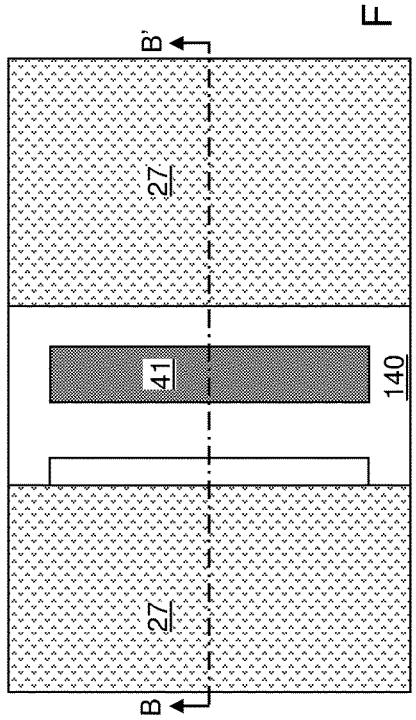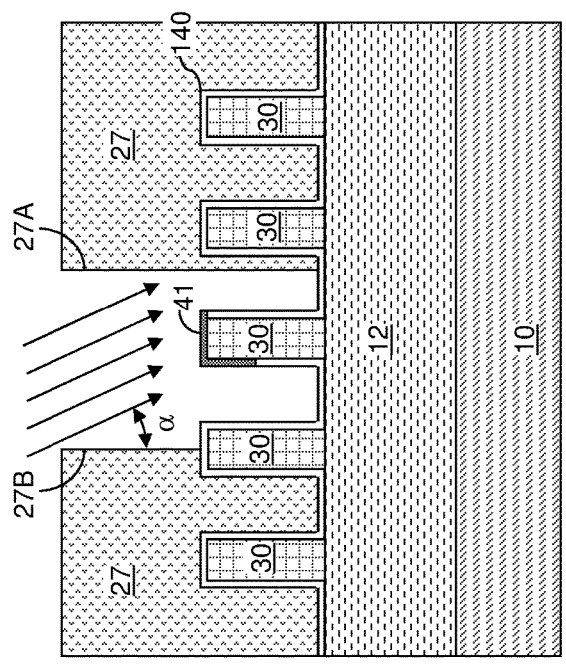

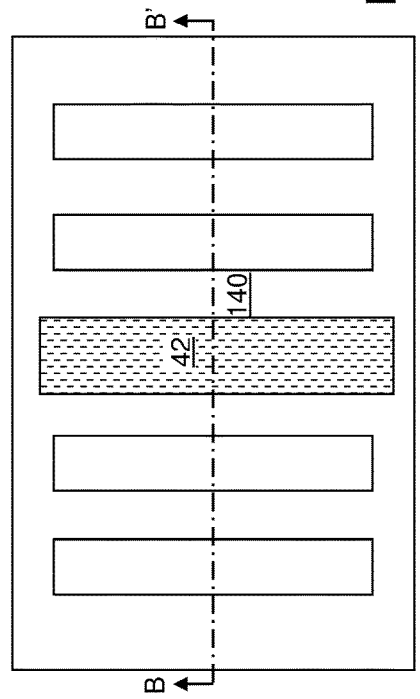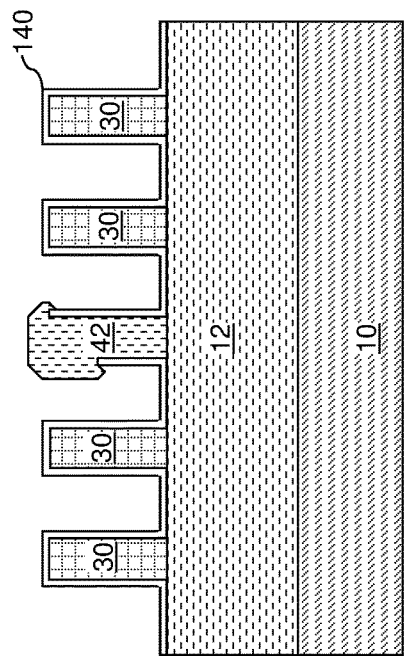

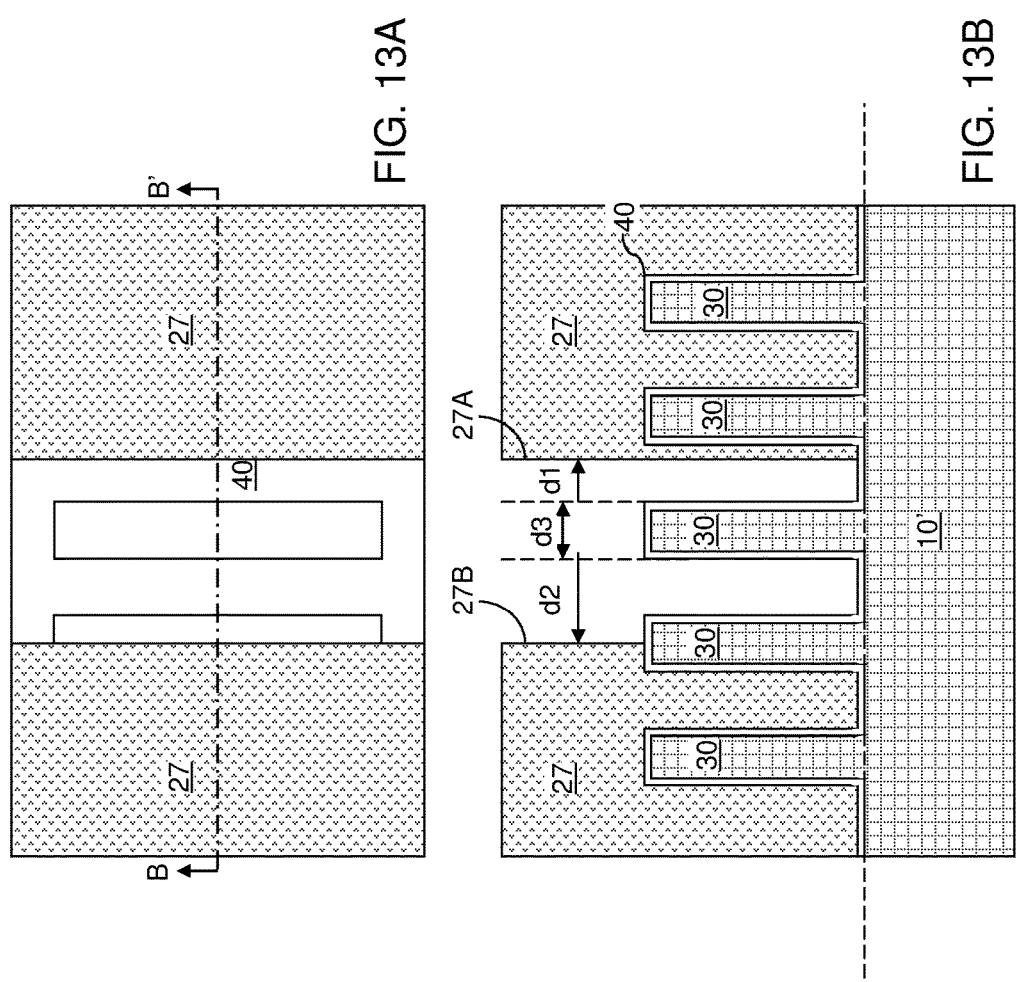

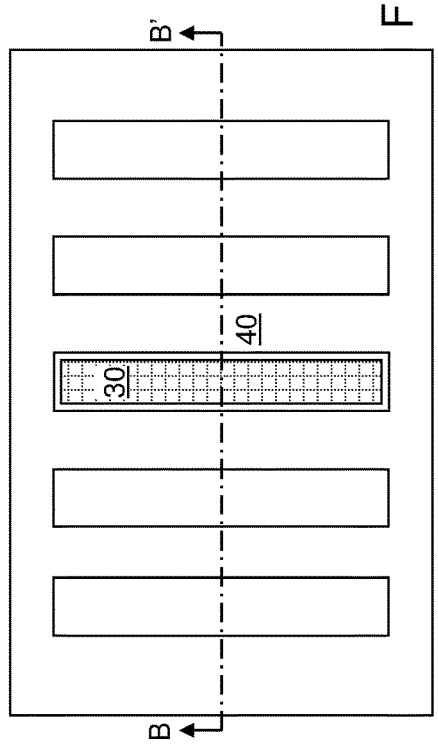
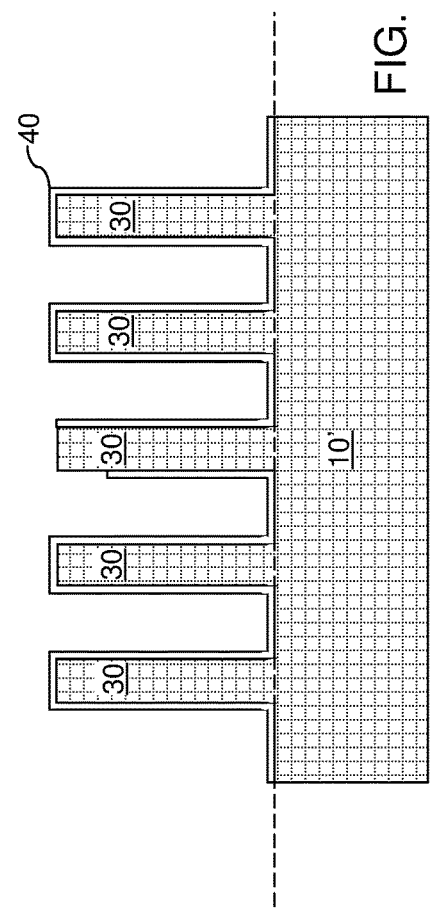
FIG. 15A
FIG. 15B

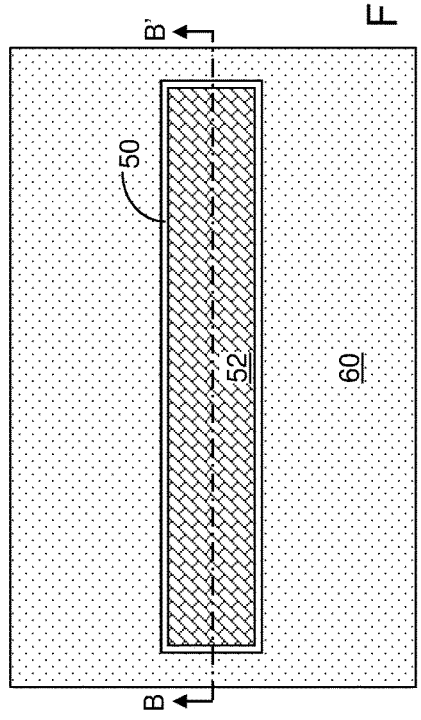
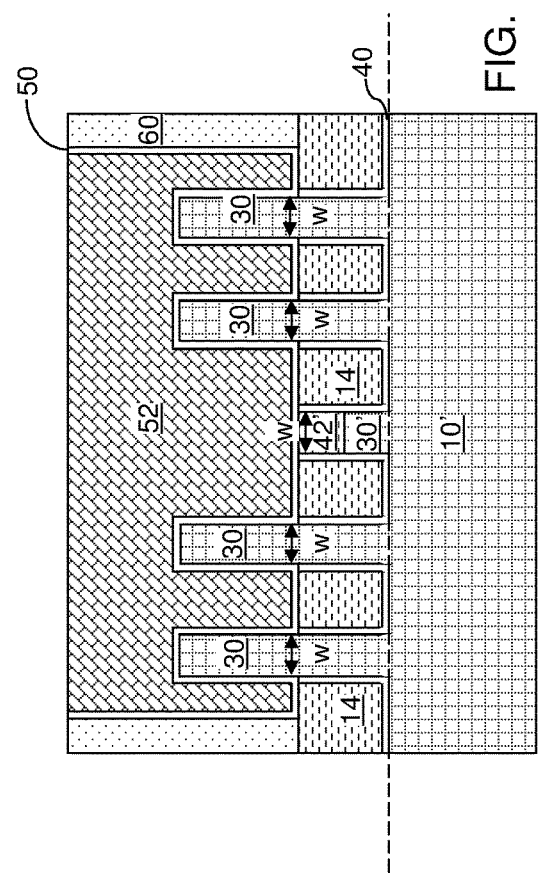

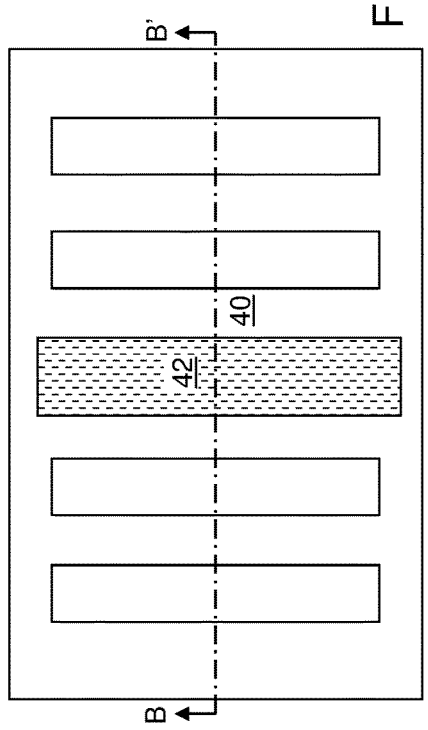
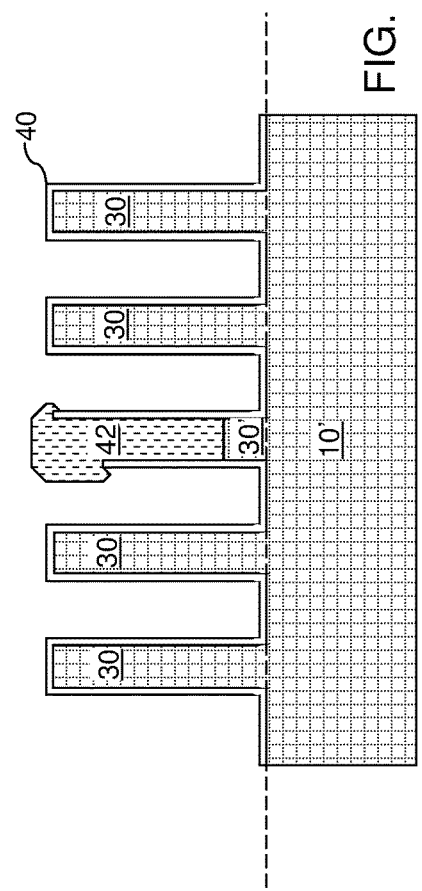

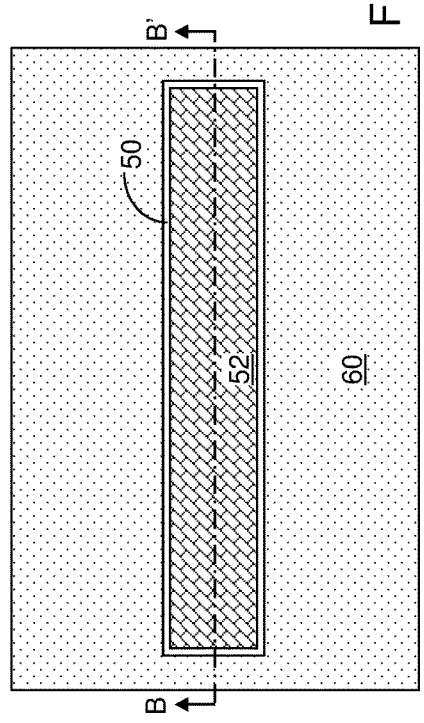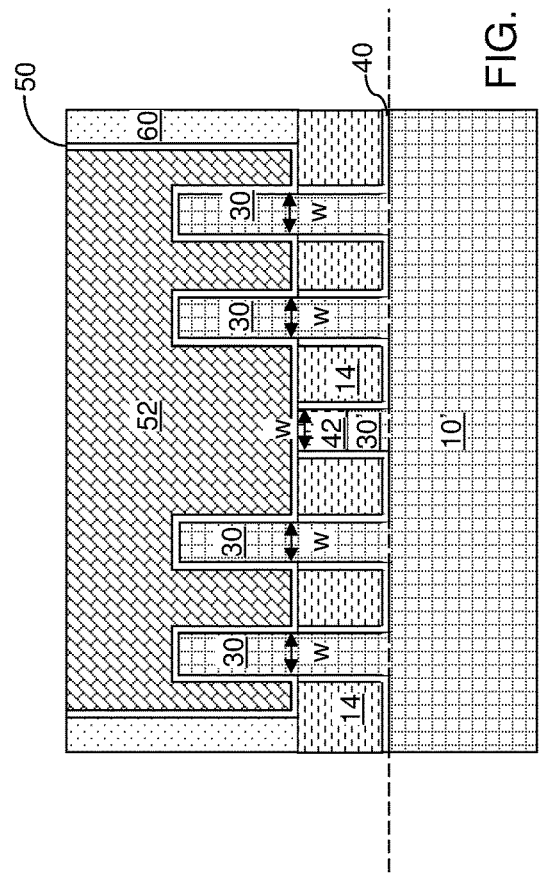

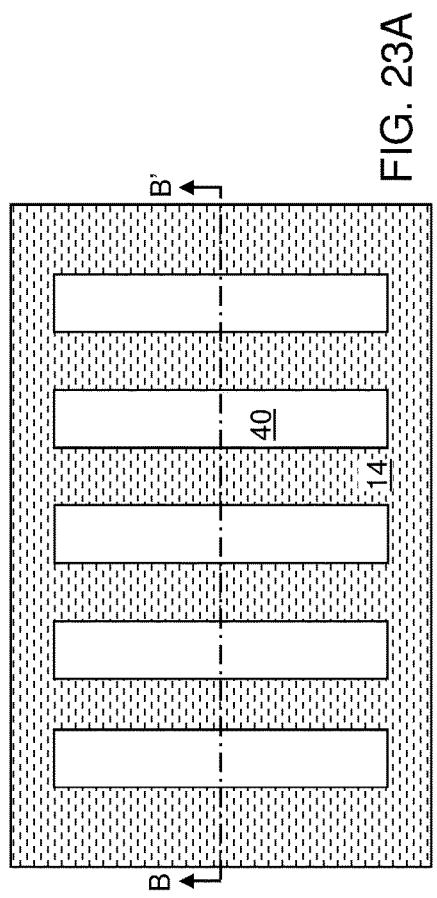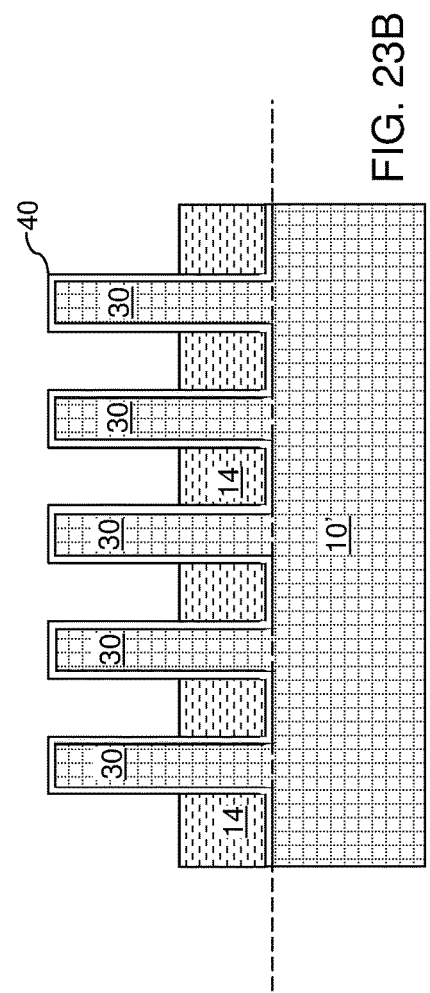

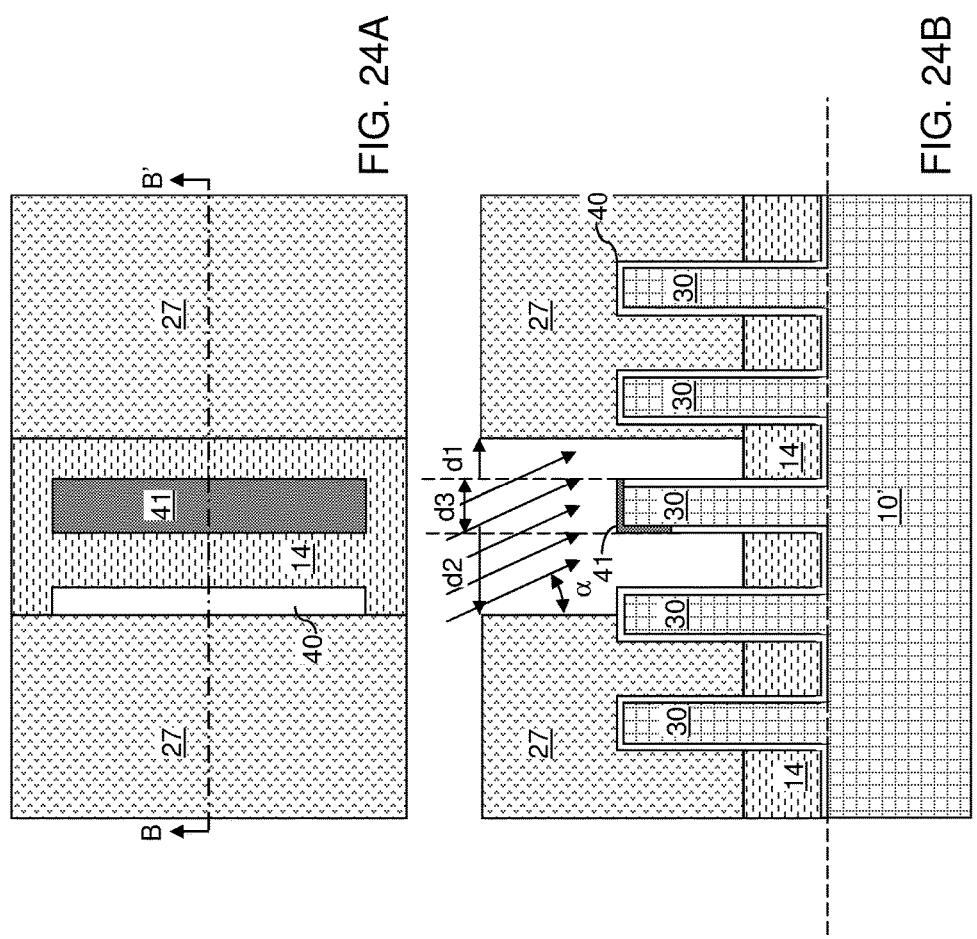

SELECTIVE REMOVAL OF SEMICONDUCTOR FINS

BACKGROUND

The present disclosure relates to a semiconductor structure, and more particularly to a semiconductor structure from which at least one semiconductor fin is removed selective to other semiconductor fins, and a method of forming the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

The on-current of a finFET is determined by the number of semiconductor fins employed to provide channel regions. To form finFET's, a plurality of semiconductor fins can be formed as an array. Subsequently, a subset of semiconductor fins not to be employed to form finFET's can be removed selective to other semiconductor fins. Remaining portions of the semiconductor fins are employed to form finFET's.

SUMMARY

An array of semiconductor fins is formed on a top surface of a substrate. A dielectric material liner is formed on the surfaces of the array of semiconductor fins. A photoresist layer is applied over the array of semiconductor fins, and is patterned such that sidewalls of an opening in the photoresist layer are parallel to the lengthwise direction of the semiconductor fins, and are asymmetrically laterally offset from a lengthwise direction passing through the center of mass of a semiconductor fin to be subsequently removed. An angled ion implantation is performed to convert a top portion of dielectric material liner into a compound material portion. The compound material portion is removed selective to the remaining dielectric material liner, and the physically exposed semiconductor fin can be removed by an etch or converted into a dielectric material portion by a conversion process. The dielectric material liner can be removed after removal of the semiconductor fin.

According to an aspect of the present disclosure, a semiconductor structure includes a plurality of semiconductor fins located on a substrate. Each of the plurality of semiconductor fins has a parallel pair of semiconductor sidewalls that are laterally spaced from each other by a uniform fin width. The semiconductor structure further includes a dielectric material portion having a parallel pair of dielectric sidewalls that are parallel to the parallel pairs of semiconductor sidewalls. A bottom surface of the dielectric material portion adjoining the parallel pair of dielectric sidewalls has a same width as the uniform fin width.

According to another aspect of the present disclosure, a method of forming a semiconductor structure is provided. A plurality of semiconductor fins is formed on a substrate. A material liner is formed on physically exposed surfaces of the plurality of semiconductor fins and the substrate. A photoresist layer is applied, and patterned, over the material liner. At least a semiconductor fin is positioned between a pair of sidewalls of the patterned photoresist layer. An implant material is implanted into a top portion of the material liner employing an angled implantation process. A first sidewall portion of the material liner located on one side of the semiconductor fin and a top portion of the material liner are converted into an compound material portion. The implant material is not implanted into a second sidewall portion of the material liner located on another side of semiconductor fin. The compound material portion is removed selective to remaining portions of the material liner that are not implanted with the implant material.

BRIEF DESCRIPTION OF SEVERAL VIEWS OF THE DRAWINGS

FIG. 2A is a top-down view of the first exemplary semiconductor structure after deposition of a material liner according to the first embodiment of the present disclosure.

FIG. 2B is a vertical cross-sectional view of the first exemplary semiconductor structure along the vertical plane B-B' in FIG. 2A.

FIG. 3A is a top-down view of the first exemplary semiconductor structure after application and patterning of a photoresist layer according to the first embodiment of the present disclosure.

FIG. 3B is a vertical cross-sectional view of the first exemplary semiconductor structure along the vertical plane B-B' in FIG. 3A.

FIG. 4A is a top-down view of the first exemplary semiconductor structure during angled implantation of implant material and formation of a compound material portion according to the first embodiment of the present disclosure.

FIG. 4B is a vertical cross-sectional view of the first exemplary semiconductor structure along the vertical plane B-B' in FIG. 4A.

FIG. 9A is a top-down view of a second exemplary semiconductor structure after conversion of a semiconductor fin into a dielectric material portion according to a second embodiment of the present disclosure.

FIG. 9B is a vertical cross-sectional view of the second exemplary semiconductor structure along the vertical plane B-B' in FIG. 9A.

FIG. 13A is a top-down view of the third exemplary semiconductor structure after application and patterning of a photoresist layer according to the third embodiment of the present disclosure.

FIG. 13B is a vertical cross-sectional view of the third exemplary semiconductor structure along the vertical plane B-B' in FIG. 13A.

FIG. 15A is a top-down view of the third exemplary semiconductor structure after removal of the photoresist layer and the compound material portion according to the third embodiment of the present disclosure.

FIG. 15B is a vertical cross-sectional view of the third exemplary semiconductor structure along the vertical plane B-B' in FIG. 15A.

FIG. 19A is a top-down view of a variation of the third exemplary semiconductor structure according to the third embodiment of the present disclosure.

FIG. 19B is a vertical cross-sectional view of the variation of the third exemplary semiconductor structure along the vertical plane B-B' in FIG. 19A.

FIG. 20A is a top-down view of a fourth exemplary semiconductor structure after conversion of a semiconductor fin into a dielectric material portion according to the first embodiment of the present disclosure.

FIG. 20B is a vertical cross-sectional view of the fourth exemplary semiconductor structure along the vertical plane B-B' in FIG. 20A.

FIG. 22A is a top-down view of the fourth exemplary semiconductor structure after formation of a replacement gate structure according to the fourth embodiment of the present disclosure.

FIG. 22B is a vertical cross-sectional view of the fourth exemplary semiconductor structure along the vertical plane B-B' in FIG. 22A.

FIG. 23A is a top-down view of a fifth exemplary semiconductor structure after formation of a shallow trench isolation layer according to a fifth embodiment of the present disclosure.

FIG. 23B is a vertical cross-sectional view of the fifth exemplary semiconductor structure along the vertical plane B-B' in FIG. 23A.

FIG. 24A is a top-down view of the fifth exemplary semiconductor structure during angled implantation of implant material and formation of a compound material portion after application and patterning of a photoresist layer according to the fifth embodiment of the present disclosure.

FIG. 24B is a vertical cross-sectional view of the fifth exemplary semiconductor structure along the vertical plane B-B' in FIG. 24A.

DETAILED DESCRIPTION

Figure 1A:
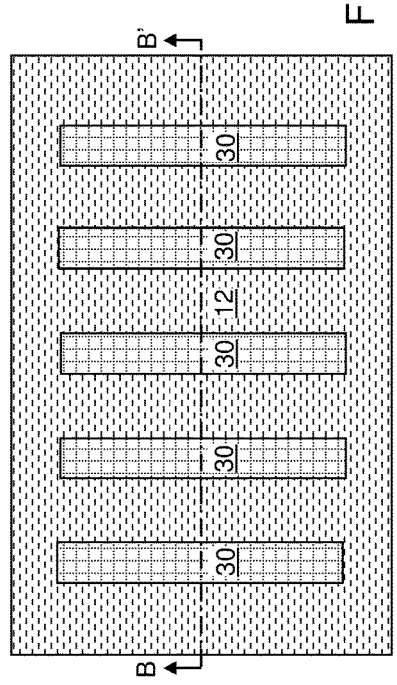
FIG. 1A is a top-down view of a first exemplary semiconductor structure after formation of a plurality of semiconductor fins according to a first embodiment of the present disclosure.

As stated above, the present disclosure relates to a semiconductor structure from which at least one semiconductor fin is removed selective to other semiconductor fins, and a method of forming the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1B:
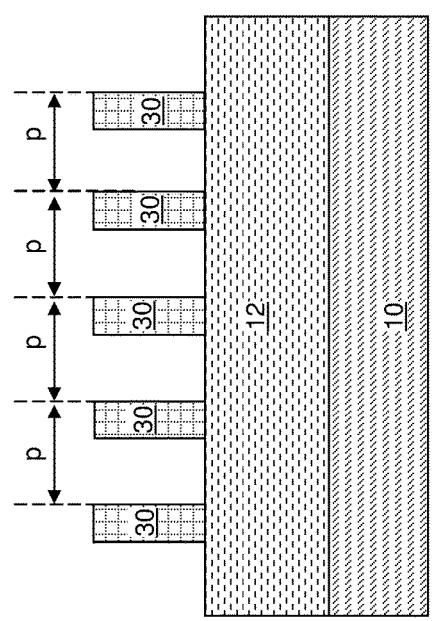
FIG. 1B is a vertical cross-sectional view of the first exemplary semiconductor structure along the vertical plane B-B' in FIG. 1A.

Referring to FIGS. 1A and 1B, a first exemplary semiconductor structure according to a first embodiment of the present disclosure includes semiconductor fins 30 formed on a top surface of a substrate (10, 12). As used herein, a "semiconductor fin" refers to a semiconductor material portion having a pair of parallel sidewalls. The horizontal direction of an axis passing through the center of a semiconductor fin, and about which the moment of inertia of the semiconductor fin is at a minimum, is herein referred to as a "lengthwise direction" of the semiconductor fin.

The semiconductor fins 30 include a semiconductor material. In one embodiment, the substrate (10, 12) can be a vertical stack including a handle substrate 10 and a buried insulator layer 12, and the semiconductor fins 30 can be formed by patterning a top semiconductor layer of a semiconductor-on-insulator (SOI) substrate including the buried insulator layer 20 and the handle substrate 10. Alternatively, a bulk semiconductor substrate can be employed in lieu of an SOI substrate, and a top portion of the bulk semiconductor substrate can be patterned to provide the semiconductor fins 30. In this case, the substrate underlying the semiconductor fins 30 can be unpatterned portions of the bulk semiconductor substrate.

Each of the semiconductor fins 30 can include a single crystalline semiconductor material. The single crystalline semiconductor material can be, for example, silicon, germanium, silicon-germanium alloy, silicon carbon alloy, silicon-germanium-carbon alloy, gallium arsenide, indium arsenide, indium phosphide, other III-V compound semiconductor materials, II-VI compound semiconductor materials, organic semiconductor materials, and other compound semiconductor materials. In an exemplary case, the single crystalline semiconductor material can include single crystalline silicon or a single crystalline alloy of silicon.

Optionally, dielectric fin caps (not shown) having the same horizontal cross-sectional area as underlying semiconductor fins 30 may be formed on the top surface of each semiconductor fin 30, for example, by forming a dielectric material layer (not shown) above the single crystalline semiconductor layer prior to application of the photoresist layer, and by patterning the dielectric material layer through transfer of the pattern in the patterned photoresist layer into the dielectric material layer employing an anisotropic etch.

In one embodiment, the semiconductor fins 30 may, or may not, be doped with p-type dopants or n-type dopants. The height of the semiconductor fins 30 can be from 20 nm to 300 nm, although greater and lesser thicknesses can also be employed. The width of the semiconductor fins 30 can be in a range from 3 nm to 100 nm, although lesser and greater widths can also be employed.

In one embodiment, each of the semiconductor fins 30 can have the same width. Further, the semiconductor fins 30 can be formed in a configuration of a one-dimensional array having a pitch p. The direction of the width and the direction of the pitch p can be the same horizontal direction that is perpendicular to the lengthwise direction of the semiconductor fins 30.

Referring to FIGS. 2A and 2B, a material liner 140 is formed on physically exposed surfaces of the plurality of semiconductor fins 30 and the substrate (10, 12). The material liner 140 can include a dielectric material, a semiconductor material, or a conductive material, and can be formed employing a conformal deposition method such as chemical vapor deposition (CVD) or atomic layer deposition (ALD). The thickness of the material layer 140 can be in a range from 5 nm to 100 nm, although lesser and greater thicknesses can also be employed.

The material liner 140 includes a material that provides a greater etch rate to an etchant upon implantation of a dopant material. In one embodiment, the material liner 140 can include a dielectric material. For example, the material liner 140 can include silicon nitride or a dielectric metal oxide that can be etched at a greater etch rate, for example, in hot phosphoric acid upon implantation of noble gas atoms or semiconductor atoms. The structural damage to the material liner 140 by the implanted atoms can cause enhancement of the etch rate. In another example, the material liner 140 can include silicon oxide that can be etched at a greater etch rate, for example, in hydrofluoric acid upon implantation of dopant atoms such as phosphorus, boron, and/or fluorine. In yet another example, the material liner 140 can include amorphous carbon, which can be removed at a greater removal rate if implanted with oxygen. In one embodiment, the material liner 40 includes silicon nitride.

In another embodiment, the material liner 140 can include a semiconductor material that is different from the semiconductor material of the plurality of semiconductor fins 30. For example, if the semiconductor fins 30 include silicon, the material liner 140 can include a compound semiconductor material. In this case, structural damage and/or compositional change by implantation of dopant atoms can cause enhancement of the etch rate to an etch chemistry for the implanted portions of the material liner 140. In another example, if the semiconductor fins 30 include a compound semiconductor material, the material liner 140 can include silicon. In this case, implantation of germanium as dopants can cause enhancement of the etch rate of the implanted portion to a wet etch chemistry employing a combination of hydrogen peroxide and hydrofluoric acid.

In yet another embodiment, the material liner 140 can include a metallic material such as a metallic nitride. The metallic nitride can be, for example, TiN, TaN, or WN. The metallic nitride can be structurally damaged by implantation of noble gas atoms or semiconductor atoms such as Ge or Si to provide an enhanced etch rate in a wet etch etchant.

Referring to FIGS. 3A and 3B, a photoresist layer 27 is applied over the material layer 140, and is lithographically patterned to form an opening therein. At least a semiconductor fin 30 is positioned between a pair of lengthwise sidewalls of the patterned photoresist layer 27. In one embodiment, the opening in the photoresist layer 27 can include a pair of sidewalls that are parallel to the lengthwise direction of the plurality of semiconductor fins 30. One semiconductor fin 30 can be located entirely within the area of the opening in the photoresist layer 27. In one embodiment, only one semiconductor fin 30 can be located entirely within the area of the opening in the photoresist layer 27. Another semiconductor fin 30 can be partly located within the area of the opening in the photoresist layer 27.

The pair of sidewalls of the photoresist layer 27 includes a first photoresist sidewall 27A and a second photoresist sidewall 27B. The locations of the first photoresist sidewall 27A and the second photoresist sidewall 27B can be asymmetric with respect to a vertical plane passing through the center of the mass of the semiconductor fin 30 that is located entirely within the area of the opening in the photoresist layer 27. For example, a horizontal portion of the material layer 140 in contact with a top surface of a semiconductor fin 30 and vertical portions of the material layer 140 in contact with the sidewalls of the semiconductor fin 30 can be physically exposed within the opening in the photoresist layer 27. The first photoresist sidewall 27A can be laterally spaced from a vertical portion of the material layer 140 that directly contacts a lengthwise sidewall of the semiconductor fin 30 within the opening in the photoresist layer 27 by a first distance d1. The second photoresist sidewall 27B can be laterally spaced from another vertical portion of the material layer 140 that directly contacts another lengthwise sidewall of the semiconductor fin 30 within the opening in the photoresist layer 27 by a second distance d2, which is greater than the first distance d1. The lateral distance between the outer sidewalls of the vertical portions of the material layer 140 in direct contact with the sidewalls of the semiconductor fin 30 is herein referred to as a third distance d3.

In one embodiment, the first distance d1 can be less than the minimum lateral distance between outer sidewalls of vertical portions of the material layer 140 that are located on adjacent semiconductor fins 30. Further, the second distance d2 can be greater than the minimum lateral distance between outer sidewalls of vertical portions of the material layer 140 that are located on adjacent semiconductor fins 30. The second distance d2 may be lesser than, equal to, or greater than, the pitch p (See FIG. 1B) of the array of semiconductor fins 30. In this case, the first photoresist sidewall 27A can contact a horizontal portion of the material layer 140 that is in contact with a top surface of the substrate (10, 12), and the second photoresist sidewall 27B can contact another horizontal portion of the material layer 140 that is in contact with a top surface of another semiconductor fin 30 that is located only partly within the area of the opening in the photoresist layer 27.

The sum of the first distance d1, the second distance d2, and the third distance d3 is greater than the pitch p of the one dimensional array of the semiconductor fins 30, and may be lesser than, equal to, or greater than twice the pitch p of the one dimensional array of the semiconductor fins 30.

Referring to FIGS. 4A and 4B, implant material is implanted into a portion of the material layer 140 by an angled ion implantation. In one embodiment, the location of a proximal sidewall of the photoresist layer 27 extending along the lengthwise direction of the semiconductor fins 30, i.e., a sidewall of the photoresist layer 27 that is parallel to the lengthwise sidewalls of the photoresist layer 27 is most proximal to the lengthwise sidewalls of the semiconductor fin 30, is located between the semiconductor fin 30 and a neighboring semiconductor fin 30 such that the lateral distance between the proximal sidewall of the photoresist layer 27 and the vertical portions of the material layer 140 in contact with the neighboring semiconductor fin 30 is sufficient to prevent penetration of implanted material. As illustrated in FIGS. 4A and 4B, the proximal sidewall can be the first photoresist sidewall 27A.

The angle α of the ion implantation, as measured with respect to a vertical plane that is parallel to the first photoresist sidewall 27A, the second photoresist sidewall 27B, and the lengthwise sidewalls of the semiconductor fins 30, can be selected such that the implant material is not implanted into any portion of the material liner 140 that is in direct contact with any other semiconductor fin 30 except for a single semiconductor fin 30 to be subsequently removed. The implanted portion of the material layer 140 is herein referred to as a compound material portion 41. The compound material portion 41 includes the entirety of a top portion of the material layer 140 that overlies a semiconductor fin 30, and can include a sub-portion of a vertical portion of the material layer 140 that contacts a lengthwise sidewall of the semiconductor fin 30. In one embodiment, the angle α of the ion implantation can be in a range from 5 degrees to 45 degrees, although lesser and greater angles can also be employed. The energy of the ion implantation is selected such that the implant material does not penetrate the material layer 140 or any vertical portion of the photoresist layer 27 that protects a masked portion of the material layer 140.

When the implant material is implanted into a top portion of the material liner 140 employing the angled implantation process, a first sidewall portion of the material liner 140 located on one side of the semiconductor fin 30 and a top portion of the material liner 140 are converted into the compound material portion 41. The implant material is not implanted into a second sidewall portion of the material liner 140 that is located on another side, i.e., the opposite side, of semiconductor fin 30.

In one embodiment, the material liner 140 can include a dielectric material. For example, the material liner 140 can include silicon nitride or a dielectric metal oxide that can be etched at a greater etch rate, for example, in hot phosphoric acid upon implantation of noble gas atoms or semiconductor atoms. In this case, the implant material can be noble gas atoms such as Rn, Xe, Kr, Ar, or Ne, or semiconductor atoms such as Ge or Si. The structural damage to the material liner 140 by the implanted atoms can cause enhancement of the etch rate. In another example, the material liner 140 can include silicon oxide that can be etched at a greater etch rate, for example, in hydrofluoric acid upon implantation of dopant atoms such as phosphorus, boron, and/or fluorine. In this case, the implanted material can be phosphorus, boron, and/or fluorine. In yet another example, the material liner 140 can include amorphous carbon, which can be removed at a greater removal rate if implanted with oxygen during an anneal at an elevated temperature. In this case, the implanted material can be oxygen atoms or ozone atoms.

In another embodiment, the material liner 140 can include a semiconductor material that is different from the semiconductor material of the plurality of semiconductor fins 30. For example, if the semiconductor fins 30 include silicon, the material liner 140 can include a compound semiconductor material. In this case, the implant material can be a compound semiconductor material can be, for example, GaAs or InAs. Structural damage and/or compositional change by implantation of dopant atoms can cause enhancement of the etch rate to an etch chemistry for the implanted portions of the material liner 140. In another example, if the semiconductor fins 30 include a compound semiconductor material, the material liner 140 can include silicon. In this case, the implant material can be germanium atoms or silicon atoms. Implantation of germanium as dopants can cause enhancement of the etch rate of the implanted portion to a wet etch chemistry employing a combination of hydrogen peroxide and hydrofluoric acid.

In yet another embodiment, the material liner 140 can include a metallic material such as a metallic nitride. The metallic nitride can be, for example, TiN, TaN, or WN. In this case, the implant material can be noble gas atoms or semiconductor atoms such as Ge or Si. The metallic nitride can be structurally damaged by implantation of the implant material to provide an enhanced etch rate in a wet etch etchant.

Figure 5A:
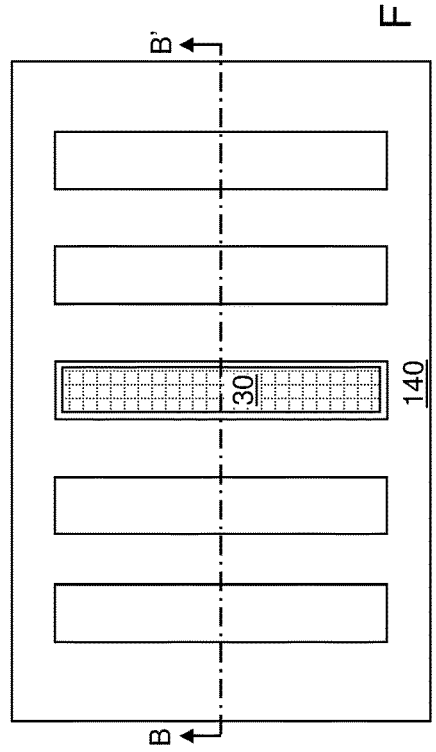
FIG. 5A is a top-down view of the first exemplary semiconductor structure after removal of the photoresist layer and the compound material portion according to the first embodiment of the present disclosure.
Figure 5B:
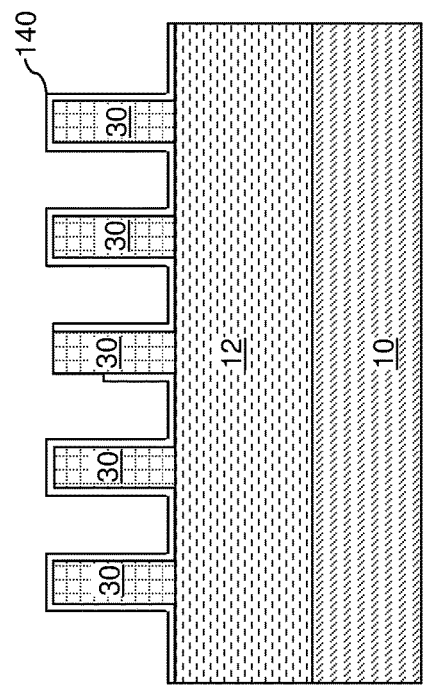
FIG. 5B is a vertical cross-sectional view of the first exemplary semiconductor structure along the vertical plane B-B' in FIG. 5A.

Referring to FIGS. 5A and 5B, an etch process and removal of the photoresist layer 27 are performed. In one embodiment, the etch process can be performed prior to the removal of the photoresist layer 27. In another embodiment, the removal of the photoresist layer 27 can be performed prior to the etch process.

During the etch process, the compound material portion 41 is removed selective to remaining portions of the material liner 140 that are not implanted with the implant material. The compound material portion 41 is removed at a faster etch rate than the material layer 140. The nature of the etch process is selected such that the etch rate for the compound material portion 41 is greater than the etch rate for the material layer 140.

For example, if the material liner 140 includes silicon nitride or a dielectric metal oxide, and if the compound material portion 41 includes a structural-damage inducing implanted material of noble gas atoms or semiconductor atoms, then the etch process can employ any etch chemistry providing an accelerated etch rate for the structural damage such as a wet etch employing hot phosphoric acid. If the material liner 140 includes undoped silicate glass, and if the compound material portion 41 includes borosilicate glass, phosphosilicate glass, or fluorosilicate glass, the etch process can employ an etch chemistry employing hydrofluoric acid.

If the material liner 140 includes a semiconductor material that is different from the semiconductor material of the plurality of semiconductor fins 30, and if the compound material portion 41 includes an additional semiconductor material, an etch chemistry that provides a greater etch rate for the semiconductor material of the compound material portion 41 with respect to the semiconductor material of the material liner 140 can be employed. For example, if the material liner 140 includes polycrystalline or amorphous silicon, and if the compound material portion 41 includes a silicon-germanium alloy, the etch process can include an etch chemistry employing a combination of hydrogen peroxide and hydrofluoric acid.

If the material liner 140 includes a metallic material, and if the compound material portion 41 includes a metallic nitride implanted with, and structurally damaged by, noble gas atoms or semiconductor atoms, the etch process can employ any etch chemistry that provide enhanced etch rate for the compound material portion due to the structural damage therein.

If the material liner 140 includes amorphous carbon, and if the compound material portion 41 includes amorphous carbon implanted with oxygen atoms or ozone atoms, the etch process can be an anneal at an elevated temperature and in an oxygen-free environment. An optional isotropic etch may be added to remove any residual material from the compound material portion after the etch process.

The removal of the photoresist layer 27 can be performed, for example, by ashing. The top surface of a semiconductor fin 30 and an upper portion of a lengthwise sidewall of the semiconductor fin 30 are physically exposed, while the entirety of another lengthwise sidewall of the semiconductor fin 30 contacts a remaining portion of the material layer 140.

While the material liner 140 is described herein as a single layer, it is understood that the material liner 140 can have multiple layers with different materials. In this case, the angled implantation can be performed to damage a top material layer within the plurality of layers of the material liner 140 to form a compound material portion 41, the compound material portion 41 can be removed selective to the remaining material liner 140, and then underlying layer(s) within the material liner 140 can be removed until surfaces of the underlying semiconductor fin 30 are physically exposed. A remaining portion of the material liner 140 is present in regions that are not implanted within the implant material. The removal of the underlying layer(s) may, or may not, be selective to the material of the top material layer. The multiple-layered material liner can avoid the unintentional incorporation of dopants into the semiconductor fins 30.

Figure 6A:
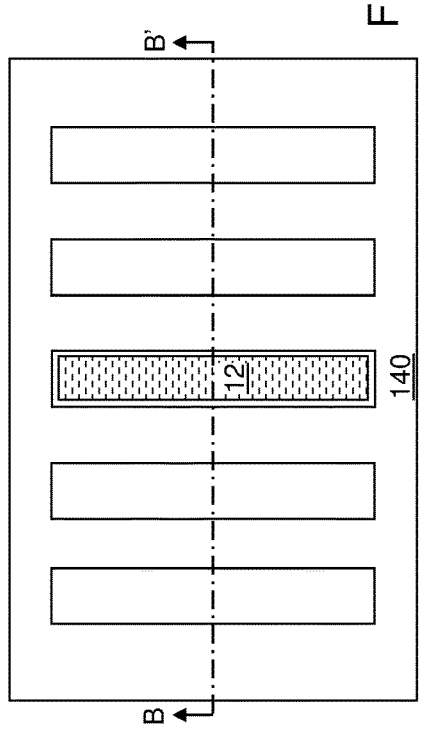
FIG. 6A is a top-down view of the first exemplary semiconductor structure after removal of a semiconductor fin according to the first embodiment of the present disclosure.
Figure 6B:
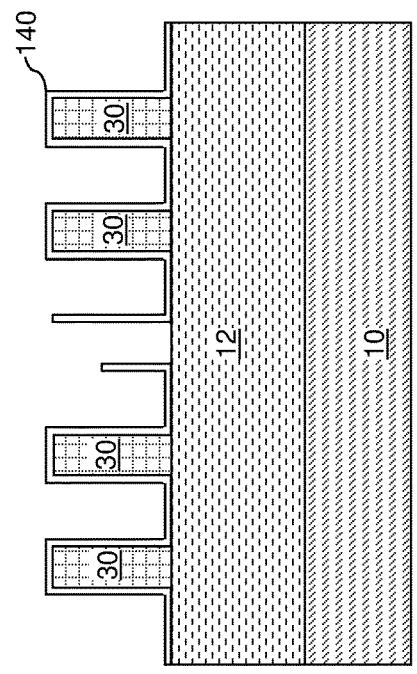
FIG. 6B is a vertical cross-sectional view of the first exemplary semiconductor structure along the vertical plane B-B' in FIG. 6A.

Referring to FIGS. 6A and 6B, the semiconductor fin 30 having a physically exposed top surface is subsequently removed selective to the remaining portions of the material liner 140. An etch process that etches the semiconductor material of the semiconductor fin 30 selective to the material of the material liner 140 can be employed. For example, a dry etch employing hydrochloric acid can be employed if the semiconductor fin 30 includes silicon. The etch chemistry of the etch process can be selected from chemistries known in the art provided that the semiconductor material of the semiconductor fin 30 is etched selective to the material liner 140. In one embodiment, the entirety of the semiconductor fin 30 having a physically exposed top surface can be removed.

Figure 7A:
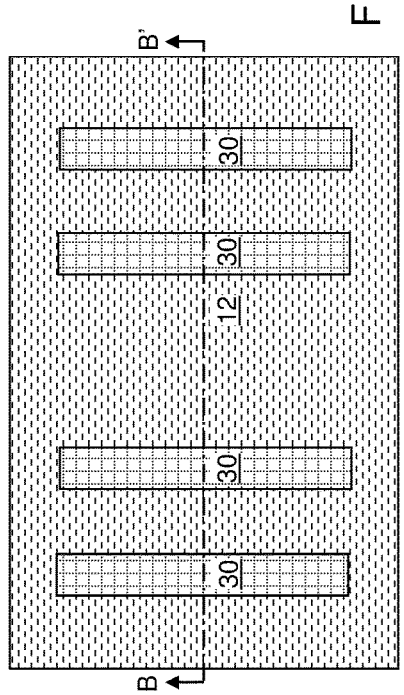
FIG. 7A is a top-down view of the first exemplary semiconductor structure after removal of the material liner according to the first embodiment of the present disclosure.
Figure 7B:
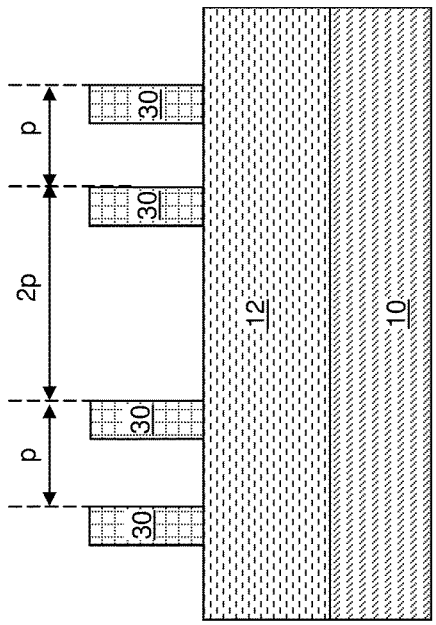
FIG. 7B is a vertical cross-sectional view of the first exemplary semiconductor structure along the vertical plane B-B' in FIG. 7A.

Referring to FIGS. 7A and 7B, at least a region of the remaining portion of the material liner 140 can be removed selective to the plurality of semiconductor fins 30. In one embodiment, the material liner 140 can be removed by an isotropic etch, which can be a wet etch or ashing. The material liner 140 can be removed selective to the semiconductor material of the plurality of semiconductor fins 30.

The first exemplary semiconductor structure thus includes pairs of semiconductor fins 30 forming a one dimensional array with a pitch p, and a pair of semiconductor fins 30 for which the center-to-center distance is 2p. As used herein, a "center-to-center distance" refers to a distance between the center of mass of a first element and the center of mass of a second element. In other words, neighboring pairs of semiconductor fins have a center-to-center distance of the pitch p, and another neighboring pair of semiconductor fins has a center-to-center distance of twice the pitch p. As used herein, a pair of elements constitutes a neighboring pair of elements if no instance of the element is present between the pair of elements. The region between the pair of semiconductor fins 30 having a center-to-center distance of 2p is herein referred to as a "gap" in the array of semiconductor fins 30.

Figure 8A:
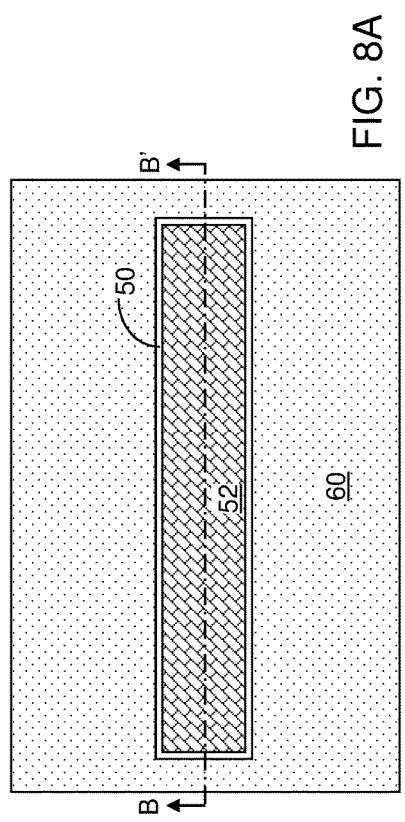
FIG. 8A is a top-down view of the first exemplary semiconductor structure after formation of a replacement gate structure according to the first embodiment of the present disclosure.
Figure 8B:
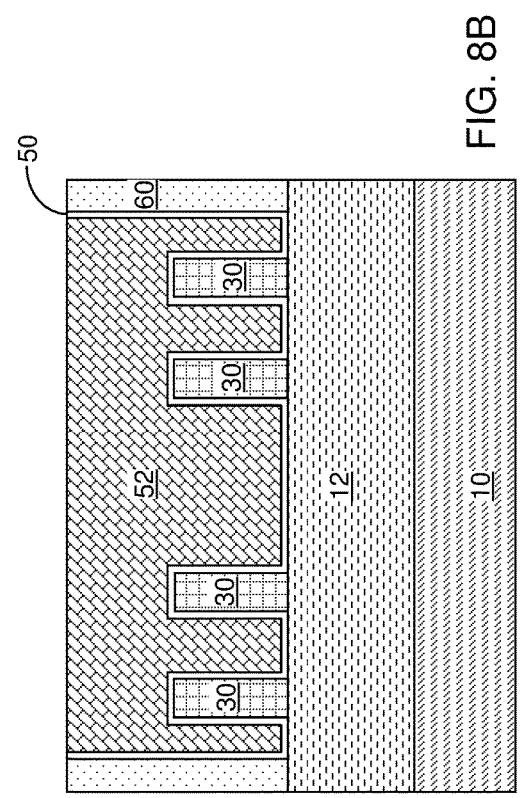
FIG. 8B is a vertical cross-sectional view of the first exemplary semiconductor structure along the vertical plane B-B' in FIG. 8A.

Referring to FIGS. 8A and 8B, further processing steps can be performed to form field effect transistors. For example, a p-type field effect transistor can be formed employing the semiconductor fins 30 on the left side of the gap, and an n-type field effect transistor can be formed employing the semiconductor fin 30 on the right side of the gap. The field effect transistors can be formed, for example, by formation of a disposable gate structure (not shown), formation of a gate spacer (not shown), formation of source regions and drain regions (not shown) in portions of the semiconductor fins 30 that are not masked by the disposable gate structure or the gate spacer, optional formation of raised source and drain regions (not shown), formation of a planarization dielectric layer 60, formation of a gate cavity by removal of the disposable gate structure, and by formation of a replacement gate structure including a gate dielectric 50 and a gate electrode 52. The gate dielectric 50 can be formed on the sidewalls of the plurality of semiconductor fins 30, and the gate electrode 52 can be formed on the gate dielectric 50.

Referring to FIGS. 9A and 9B, a second exemplary semiconductor structure according to the first embodiment of the present disclosure can be derived from the first exemplary semiconductor structure of FIGS. 5A and 5B by conversion of a semiconductor fin 30 into a dielectric material portion 42. At least a portion of the semiconductor fin 30 is converted into a dielectric material portion 42. The remaining portions of the material liner 140 after the etch process of FIGS. 5A and 5B laterally surround the dielectric material portion 42. The dielectric material portion 42 can have the same composition as, or can have a different composition from, the insulator layer 12.

The conversion of the semiconductor fin 30 into the dielectric material portion 42 can be an oxidation process, a nitridation process, or a combination of nitridation and oxidation processes. Further, the conversion process can be a thermal process or a plasma process. The dielectric material portion 42 can include a semiconductor oxide, a semiconductor nitride, or a semiconductor oxynitride.

The top portion of the semiconductor fin 30 that is converted into the dielectric material portion 42 is laterally confined at all sides at a lower portion, and is laterally confined at three sides at an upper portion without any remaining portion of the material layer 140 on one side. Thus, the volume expansion of the semiconductor fin 30 occurs asymmetrically at the top portion of the semiconductor fin 30, and the resulting dielectric material portion 42 has a greater width at an upper portion than at a lower portion. Further, the topmost surface of the dielectric material portion 42 protrudes above a horizontal plane including topmost surfaces of the semiconductor fins 30.

Figure 10A:
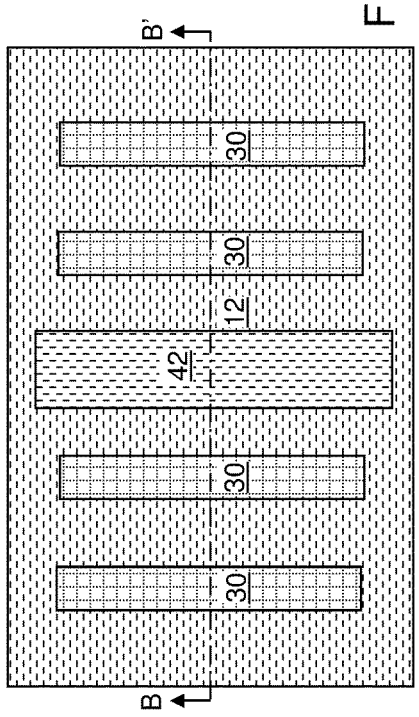
FIG. 10A is a top-down view of the second exemplary semiconductor structure after removal of the material liner according to the second embodiment of the present disclosure.
Figure 10B:
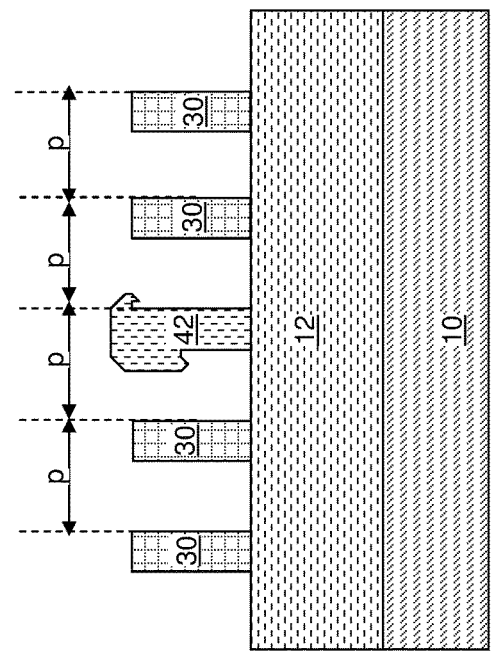
FIG. 10B is a vertical cross-sectional view of the second exemplary semiconductor structure along the vertical plane B-B' in FIG. 10A.

Referring to FIGS. 10A and 10B, the material liner 140 can be removed selective to the plurality of semiconductor fins 30 employing the processing steps of FIGS. 7A and 7B. The etch chemistry employed to remove the material liner 140 may, or may not, be selective to the dielectric material of the dielectric material portion 42. In one embodiment, the etch chemistry employed to remove the material liner 140 can be selective to the dielectric material of the dielectric material portion 42.

Figure 11A:
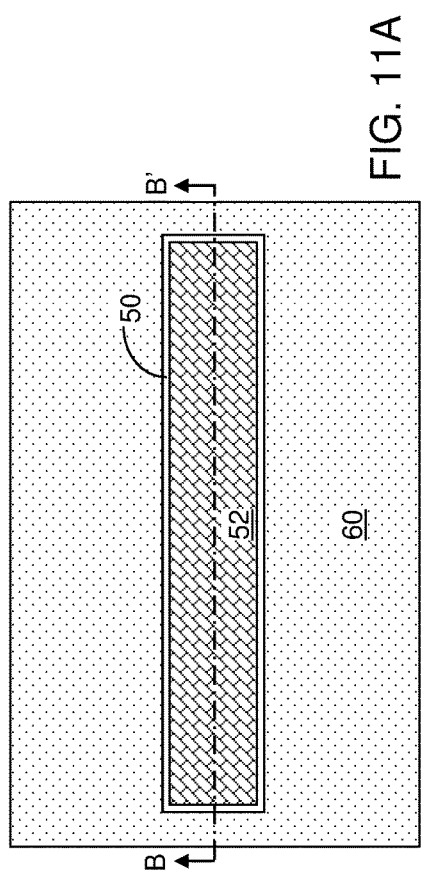
FIG. 11A is a top-down view of the second exemplary semiconductor structure after formation of a replacement gate structure according to the second embodiment of the present disclosure.
Figure 11B:
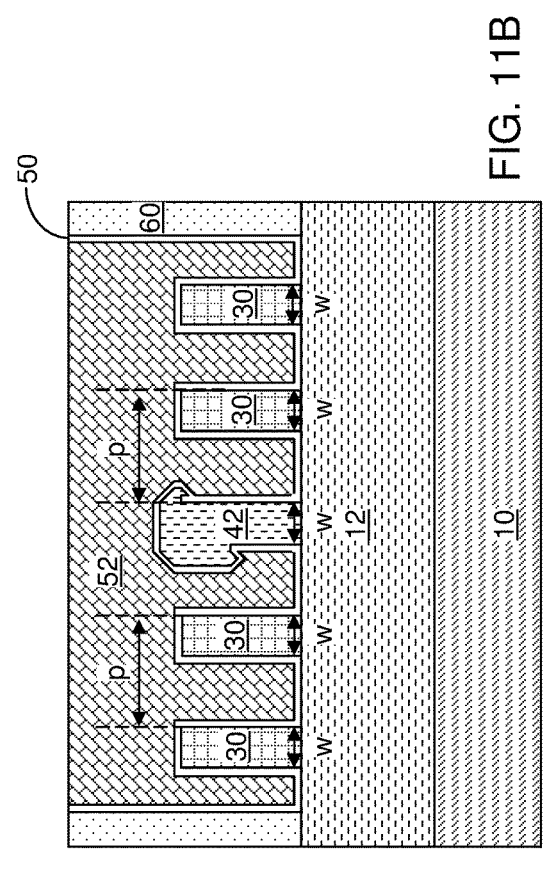
FIG. 11B is a vertical cross-sectional view of the second exemplary semiconductor structure along the vertical plane B-B' in FIG. 11A.

Referring to FIGS. 11A and 11B, the processing steps of FIGS. 8A and 8B are performed to form field effect transistors. A replacement gate structure (50, 52) including a gate dielectric 50 and a gate electrode 52 is formed. The gate dielectric 50 is formed on sidewalls of the plurality of semiconductor fins 30 and surfaces of the dielectric material portion 42.

The second exemplary semiconductor structure includes a plurality of semiconductor fins 30 located on a substrate (10, 12). Each of the plurality of semiconductor fins 30 has a parallel pair of semiconductor sidewalls that are laterally spaced from each other by a uniform fin width w. The second exemplary semiconductor structure further includes a dielectric material portion 42 having a parallel pair of dielectric sidewalls, i.e., the sidewalls of a lower portion of the dielectric material portion 42. The parallel pair of dielectric sidewalls is parallel to the parallel pairs of semiconductor sidewalls. A bottom surface of the dielectric material portion 42 adjoining the parallel pair of dielectric sidewalls can have the same width as the uniform fin width w.

In one embodiment, an upper sub-portion of the dielectric material portion 42 has a greater width than the uniform fin width w. In one embodiment, the plurality of semiconductor fins 30 can include at least two semiconductor fins 30 that constitute a one-dimensional array having a uniform pitch p (See FIGS. 1A and 1B) along a direction perpendicular to the parallel pairs of semiconductor sidewalls of the semiconductor fins 30. The lateral distance between a semiconductor sidewall of one of the at least two semiconductor fins 30 and one of the parallel pair of dielectric sidewalls is the same as the uniform pitch p.

A vertical cross-sectional shape of the dielectric material portion 42 along a vertical plane perpendicular to the parallel pair of dielectric sidewalls is asymmetric as illustrated in FIG. 11B. The dielectric material portion 42 protrudes farther upward from the top surface of the substrate (10, 12) than a topmost portion of the plurality of semiconductor fins 30.

Figure 12A:
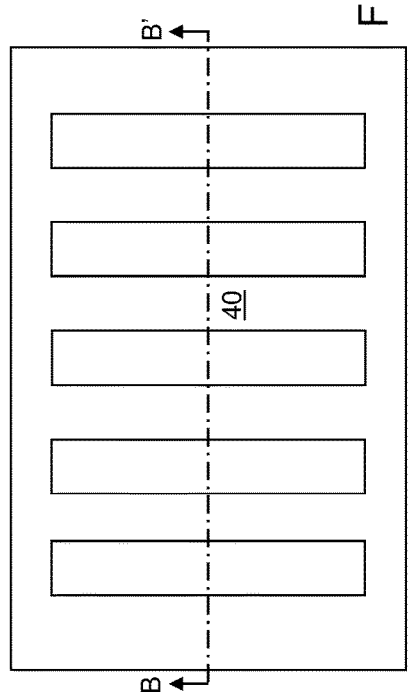
FIG. 12A is a top-down view of a third exemplary semiconductor structure after formation of a plurality of semiconductor fins according to a third embodiment of the present disclosure.
Figure 12B:
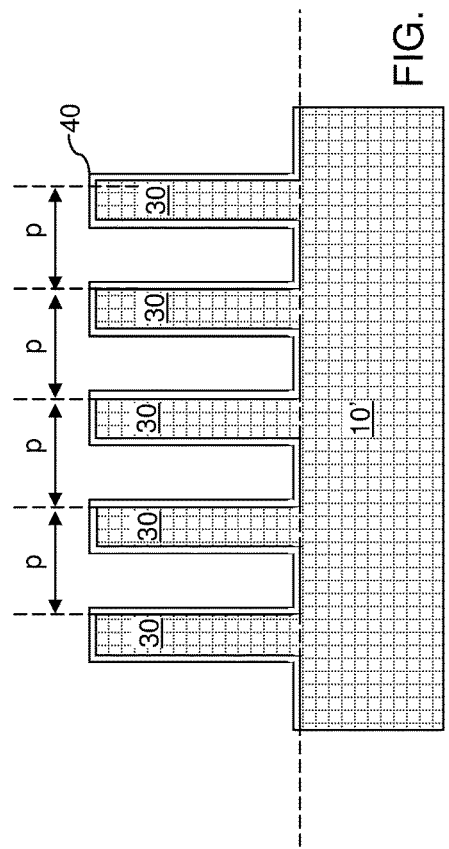
FIG. 12B is a vertical cross-sectional view of the third exemplary semiconductor structure along the vertical plane B-B' in FIG. 12A.

Referring to FIGS. 12A and 12B, a third exemplary semiconductor structure can be formed by providing a bulk semiconductor substrate and patterning a top portion of the bulk semiconductor substrate into a plurality of semiconductor fins 30 in a configuration of a one-dimensional array having a pitch p. The unpatterned bottom portion of the bulk semiconductor substrate constitutes a substrate 10', which is structurally equivalent to the stack of the insulator layer 12 and the handle substrate 10 in the first and second exemplary semiconductor structures.

A material liner 40 is formed on the surfaces of the semiconductor fins 30 and on the top surface of the substrate 10'. The material liner 40 of the third embodiment includes a dielectric material that provides a greater etch rate to an etchant upon implantation of a dopant material. In one embodiment, the material liner 40 can include a dielectric material. For example, the material liner 40 can include silicon nitride or a dielectric metal oxide that can be etched at a greater etch rate, for example, in hot phosphoric acid upon implantation of noble gas atoms or semiconductor atoms. The structural damage to the material liner 40 by the implanted atoms can cause enhancement of the etch rate. In another example, the material liner 40 can include silicon oxide that can be etched at a greater etch rate, for example, in hydrofluoric acid upon implantation of dopant atoms such as phosphorus, boron, and/or fluorine. In yet another example, the material liner 40 can include amorphous carbon, which can be removed at a greater removal rate if implanted with oxygen. The material liner 40 can be formed by a conformal deposition method such as chemical vapor deposition (CVD) or atomic layer deposition (ALD). The thickness of the material layer 40 can be in a range from 5 nm to 100 nm, although lesser and greater thicknesses can also be employed.

Referring to FIGS. 13A and 13B, a photoresist layer 27 is applied over the material layer 40, and is lithographically patterned to form an opening therein in the same manner as in the first embodiment. At least a semiconductor fin 30 is positioned between a pair of lengthwise sidewalls of the patterned photoresist layer 27. In one embodiment, the opening in the photoresist layer 27 can include a pair of sidewalls that are parallel to the lengthwise direction of the plurality of semiconductor fins 30. One semiconductor fin 30 can be located entirely within the area of the opening in the photoresist layer 27. In one embodiment, only one semiconductor fin 30 can be located entirely within the area of the opening in the photoresist layer 27. Another semiconductor fin 30 can be partly located within the area of the opening in the photoresist layer 27.

The pair of sidewalls of the photoresist layer 27 includes a first photoresist sidewall 27A and a second photoresist sidewall 27B. The locations of the first photoresist sidewall 27A and the second photoresist sidewall 27B can be asymmetric with respect to a vertical plane passing through the center of the mass of the semiconductor fin 30 that is located entirely within the area of the opening in the photoresist layer 27. For example, a horizontal portion of the material layer 40 in contact with a top surface of a semiconductor fin 30 and vertical portions of the material layer 40 in contact with the sidewalls of the semiconductor fin 30 can be physically exposed within the opening in the photoresist layer 27. The first photoresist sidewall 27A can be laterally spaced from a vertical portion of the material layer 40 that directly contacts a lengthwise sidewall of the semiconductor fin 30 within the opening in the photoresist layer 27 by a first distance d1. The second photoresist sidewall 27B can be laterally spaced from another vertical portion of the material layer 40 that directly contacts another lengthwise sidewall of the semiconductor fin 30 within the opening in the photoresist layer 27 by a second distance d2, which is greater than the first distance d1. The lateral distance between the outer sidewalls of the vertical portions of the material layer 40 in direct contact with the sidewalls of the semiconductor fin 30 is herein referred to as a third distance d3.

In one embodiment, the first distance d1 can be less than the minimum lateral distance between outer sidewalls of vertical portions of the material layer 40 that are located on adjacent semiconductor fins 30. Further, the second distance d2 can be greater than the minimum lateral distance between outer sidewalls of vertical portions of the material layer 40 that are located on adjacent semiconductor fins 30. The second distance d2 may be lesser than, equal to, or greater than, the pitch p (See FIG. 1B) of the array of semiconductor fins 30. In this case, the first photoresist sidewall 27A can contact a horizontal portion of the material layer 40 that is in contact with a top surface of the substrate (10, 12), and the second photoresist sidewall 27B can contact another horizontal portion of the material layer 40 that is in contact with a top surface of another semiconductor fin 30 that is located only partly within the area of the opening in the photoresist layer 27.

The sum of the first distance d1, the second distance d2, and the third distance d3 is greater than the pitch p of the one dimensional array of the semiconductor fins 30, and may be lesser than, equal to, or greater than twice the pitch p of the one dimensional array of the semiconductor fins 30.

Figure 14A:
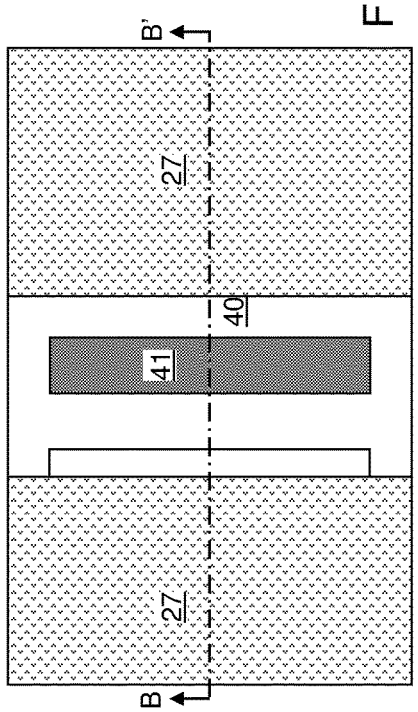
FIG. 14A is a top-down view of the third exemplary semiconductor structure during angled implantation of implant material and formation of a compound material portion according to the third embodiment of the present disclosure.
Figure 14B:
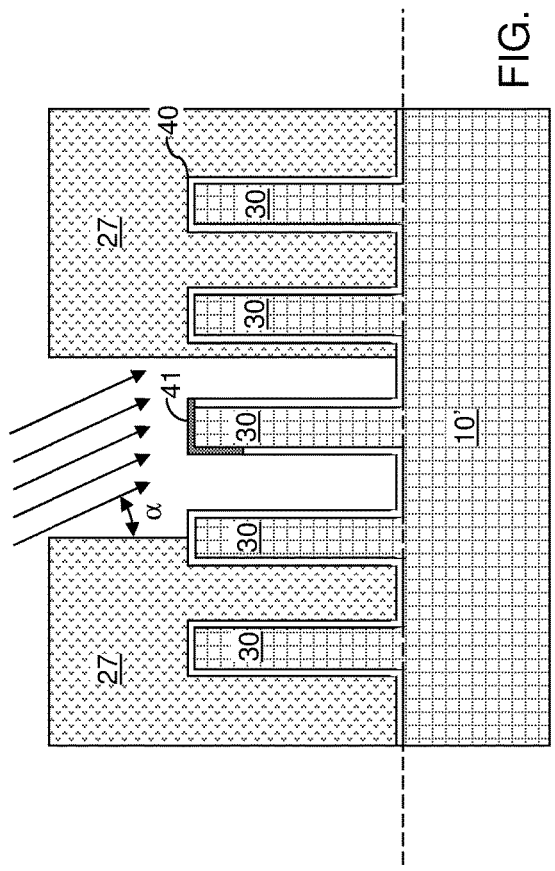
FIG. 14B is a vertical cross-sectional view of the third exemplary semiconductor structure along the vertical plane B-B' in FIG. 14A.

Referring to FIGS. 14A and 14B, implant material is implanted into a portion of the material layer 40 by an angled ion implantation. In one embodiment, the location of a proximal sidewall of the photoresist layer 27 extending along the lengthwise direction of the semiconductor fins 30, i.e., a sidewall of the photoresist layer 27 that is parallel to the lengthwise sidewalls of the photoresist layer 27 is most proximal to the lengthwise sidewalls of the semiconductor fin 30, is located between the semiconductor fin 30 and a neighboring semiconductor fin 30 such that the lateral distance between the proximal sidewall of the photoresist layer 27 and the vertical portions of the material layer 40 in contact with the neighboring semiconductor fin 30 is sufficient to prevent penetration of implanted material. As illustrated in FIGS. 14A and 14B, the proximal sidewall can be the first photoresist sidewall 27A.

The angle α of the ion implantation, as measured with respect to a vertical plane that is parallel to the first photoresist sidewall 27A, the second photoresist sidewall 27B, and the lengthwise sidewalls of the semiconductor fins 30, can be selected such that the implant material is not implanted into any portion of the material liner 40 that is in direct contact with any other semiconductor fin 30 except for a single semiconductor fin 30 to be subsequently removed. The implanted portion of the material layer 40 is herein referred to as a compound material portion 41. The compound material portion 41 includes the entirety of a top portion of the material layer 40 that overlies a semiconductor fin 30, and can include a sub-portion of a vertical portion of the material layer 40 that contacts a lengthwise sidewall of the semiconductor fin 30. In one embodiment, the angle α of the ion implantation can be in a range from 5 degrees to 45 degrees, although lesser and greater angles can also be employed. The energy of the ion implantation is selected such that the implant material does not penetrate the material layer 40 or any vertical portion of the photoresist layer 27 that protects a masked portion of the material layer 40.

When the implant material is implanted into a top portion of the material liner 40 employing the angled implantation process, a first sidewall portion of the material liner 40 located on one side of the semiconductor fin 30 and a top portion of the material liner 40 are converted into the compound material portion 41. The implant material is not implanted into a second sidewall portion of the material liner 40 that is located on another side, i.e., the opposite side, of semiconductor fin 30.

In one embodiment, the material liner 40 can include a dielectric material. For example, the material liner 40 can include silicon nitride or a dielectric metal oxide that can be etched at a greater etch rate, for example, in hot phosphoric acid upon implantation of noble gas atoms or semiconductor atoms. In this case, the implant material can be noble gas atoms such as Rn, Xe, Kr, Ar, or Ne, or semiconductor atoms such as Ge or Si. The structural damage to the material liner 40 by the implanted atoms can cause enhancement of the etch rate. In another example, the material liner 40 can include silicon oxide that can be etched at a greater etch rate, for example, in hydrofluoric acid upon implantation of dopant atoms such as phosphorus, boron, and/or fluorine. In this case, the implanted material can be phosphorus, boron, and/or fluorine. In yet another example, the material liner 40 can include amorphous carbon, which can be removed at a greater removal rate if implanted with oxygen during an anneal at an elevated temperature. In this case, the implanted material can be oxygen atoms or ozone atoms. In one embodiment, the material liner 40 includes silicon nitride.

Referring to FIGS. 15A and 15B, the compound material portion 41 and the photoresist layer 27 can be removed in the same manner as in the first embodiment.

Figure 16A:
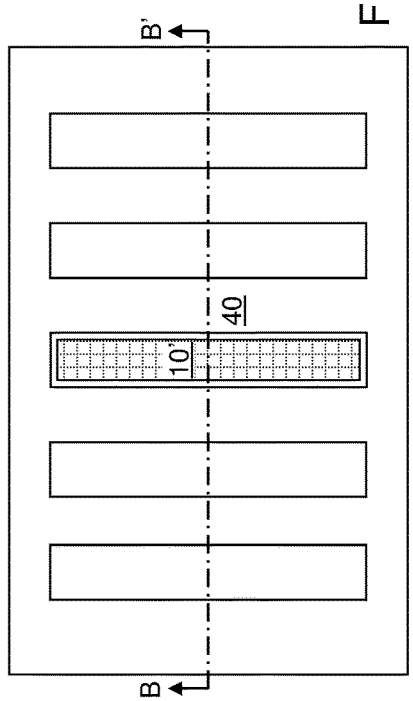
FIG. 16A is a top-down view of the third exemplary semiconductor structure after recessing of a semiconductor fin and an upper portion of a substrate according to the third embodiment of the present disclosure.
Figure 16B:
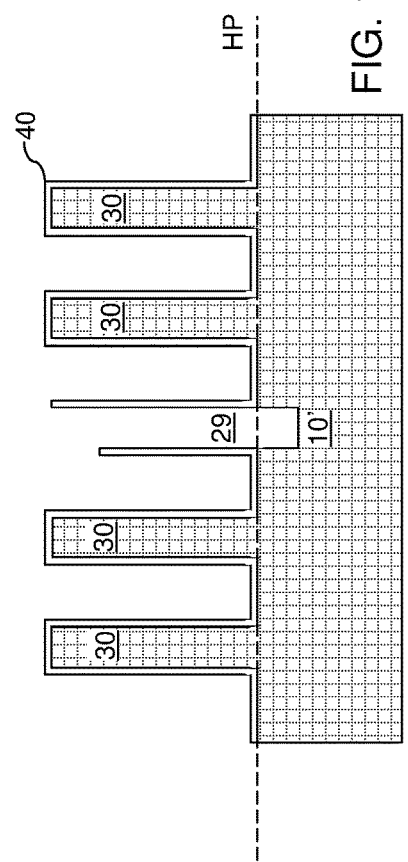
FIG. 16B is a vertical cross-sectional view of the third exemplary semiconductor structure along the vertical plane B-B' in FIG. 16A.

Referring to FIGS. 16A and 16B, the semiconductor fin 30 that is not covered by the remaining portions of the material layer 40 can be removed selective to the remaining portions of the material liner 40. For example, a dry etch employing hydrochloric acid vapor can be employed to remove the semiconductor fin 30. The dry etch can be a reactive ion etch. The recess depth of the top surface of the etched semiconductor fin 30 or the portion of the substrate 10' underlying the etched semiconductor fin 30 (in case the semiconductor fin 30 is completely etched) can be selected as needed. In one embodiment, the etched semiconductor fin 30 can be completely removed, and a portion of the substrate 10' underlying the etched semiconductor fin can be recessed below a horizontal plane HP containing the topmost surface of the substrate 10'. A cavity 29 laterally surrounded by remaining portions of the material layer 40 can be formed by recessing the etched semiconductor fin 30 selective to the remaining portions of the material liner 40.

Figure 17A:
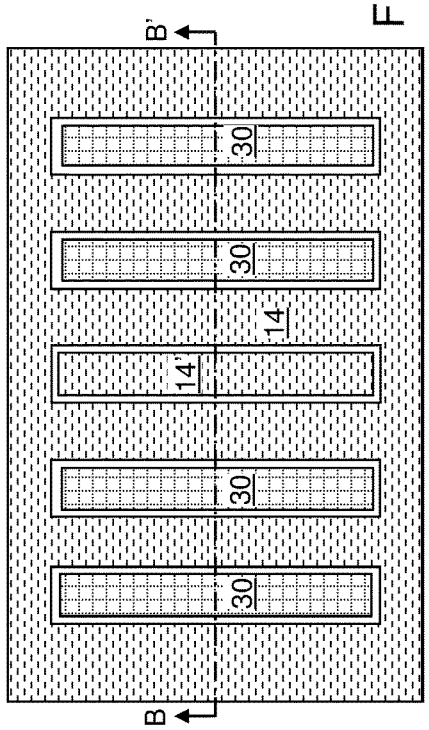
FIG. 17A is a top-down view of the third exemplary semiconductor structure after formation of a shallow trench isolation layer and a dielectric material portion according to the third embodiment of the present disclosure.
Figure 17B:
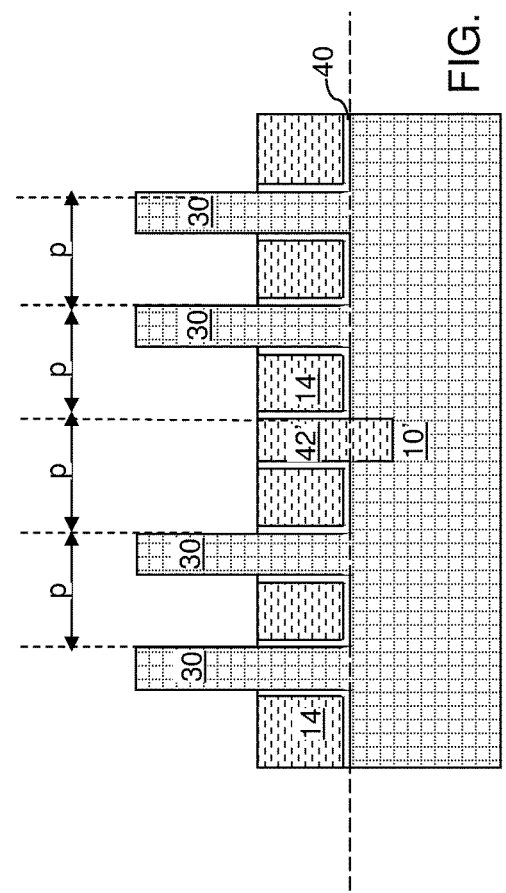
FIG. 17B is a vertical cross-sectional view of the third exemplary semiconductor structure along the vertical plane B-B' in FIG. 17A.

Referring to FIGS. 17A and 17B, a dielectric material is deposited over the material liner 40 and the plurality of semiconductor fins 30. The dielectric material can be, for example, silicon oxide or silicon oxynitride. The dielectric material fills the cavity 29 formed by recessing of the semiconductor material of the semiconductor fin 30 and optionally a top portion of the substrate 10'. The dielectric material can be planarized, for example, by chemical mechanical planarization, and can be uniformed recessed so that the remaining portion of the dielectric material after the recess etch can have top surfaces that are substantially coplanar among one another. A contiguous remaining portion of the dielectric material constitutes a shallow trench isolation layer 14. A remaining portion of the dielectric material that fills the cavity 29 constitutes a dielectric material portion 42', which has the same composition as the shallow trench isolation layer 14. The top surface of the dielectric material portion 42' can be coplanar with the top surface of the shallow trench isolation layer 14.

At least a region of the remaining portion of the material liner 40 can be removed selective to the plurality of semiconductor fins 30 by an etch process. In one embodiment, the portions of the material liner 40 that protrude above the top surface of the shallow trench isolation layer 14 can be removed by an isotropic etch. The same etch chemistry can be employed to remove the portions of the material liner 40 that protrude above the top surface of the shallow trench isolation layer 14 as in the processing steps of FIGS. 7A and 7B of the first embodiment of the present disclosure.

Figure 18A:
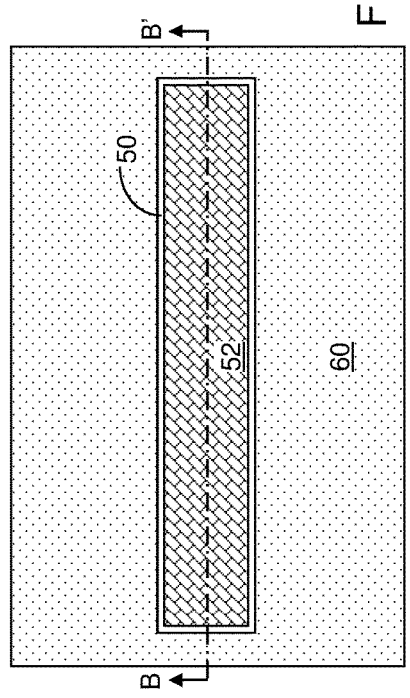
FIG. 18A is a top-down view of the third exemplary semiconductor structure after formation of a replacement gate structure according to the third embodiment of the present disclosure.
Figure 18B:
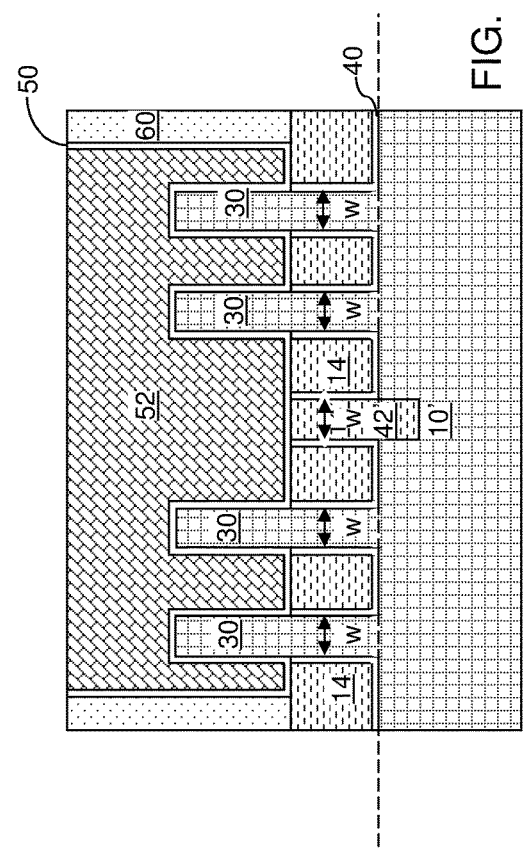
FIG. 18B is a vertical cross-sectional view of the third exemplary semiconductor structure along the vertical plane B-B' in FIG. 18A.

Referring to FIGS. 18A and 18B, the processing steps of FIGS. 8A and 8B can be performed to form field effect transistors that employ the plurality of semiconductor fins 30. A gate dielectric 50 can contact the top surface of the dielectric material portion 42' and the top surface of the remaining portion of the dielectric liner 40.

The shallow trench isolation layer 14 laterally surrounds the dielectric material portion 42' and a lower portion of each of the plurality of semiconductor fins 30. In one embodiment, the topmost surface of the dielectric material portion 42' can be coplanar with the top surface of the shallow trench isolation layer 14. In one embodiment, the bottommost surface of the dielectric material portion 42' can be vertically offset from the horizontal plane including the planar bottom surface of the shallow trench isolation layer 14. The remaining portion of the material liner 40 can be a dielectric liner contacting the top surface of the substrate 10', lower portions of the parallel pairs of semiconductor sidewalls of the semiconductor fins 30, and the parallel pair of dielectric sidewalls of the dielectric material portion 42'. In one embodiment, the dielectric material portion 42' extends below the top surface of the substrate 10' and below the horizontal plane including the planar bottom surface of the shallow trench isolation layer 14.

Referring to FIGS. 19A and 19B, a variation of the third exemplary semiconductor structure is illustrated. This variation of the third exemplary semiconductor structure can be derived from the third exemplary semiconductor structure of FIGS. 15A and 15B by vertically recessing the top surface of the physically exposed semiconductor fin 30 to a height that is above the horizontal plane HP (See FIG. 16B) including the top surface of the substrate 10'. Subsequently, the processing steps of FIGS. 17A, 17B, 18A, and 18B are performed. A semiconductor material portion 30' is formed from the remaining portion of the recessed semiconductor fin 30. The semiconductor material portion 30' has a width w that is the same as the uniform fin width w and the width of the overlying the dielectric material portion 42'.

Referring to FIGS. 20A and 20B, a fourth exemplary semiconductor structure according to the first embodiment of the present disclosure can be derived from the third exemplary semiconductor structure of FIGS. 15A and 15B by converting at least an upper portion of a semiconductor fin 30 into a dielectric material portion 42. The same processing step can be employed as the processing steps of FIGS. 9A and 9B of the second embodiment of the present disclosure. The dielectric material portion 42 can have the same composition as in the second embodiment. The material liner 40 laterally surrounds the dielectric material portion 42. The dielectric material portion 42 has a greater width at an upper portion than at a lower portion.

In one embodiment, the semiconductor fin 30 having a physically exposed top surface may be partly converted into the dielectric material of the dielectric material portion 42. In this case, a semiconductor material portion 30' including a remaining portion of the semiconductor fin 30 can be present underneath the dielectric material portion 42. In another embodiment, the entirety of the physically exposed semiconductor fin 30 and an upper portion of the substrate 10' can be converted into the dielectric material portion 42.

Figure 21A:
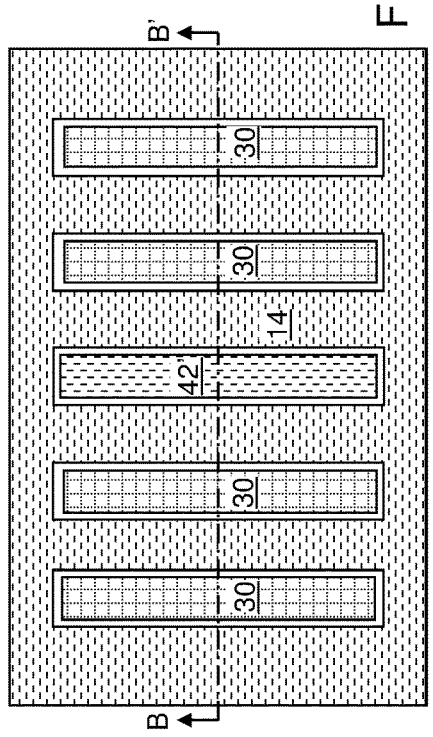
FIG. 21A is a top-down view of the fourth exemplary semiconductor structure after formation of a shallow trench isolation layer, recessing of the dielectric material portion, and removal of physically exposed portions of the material liner according to the fourth embodiment of the present disclosure.
Figure 21B:
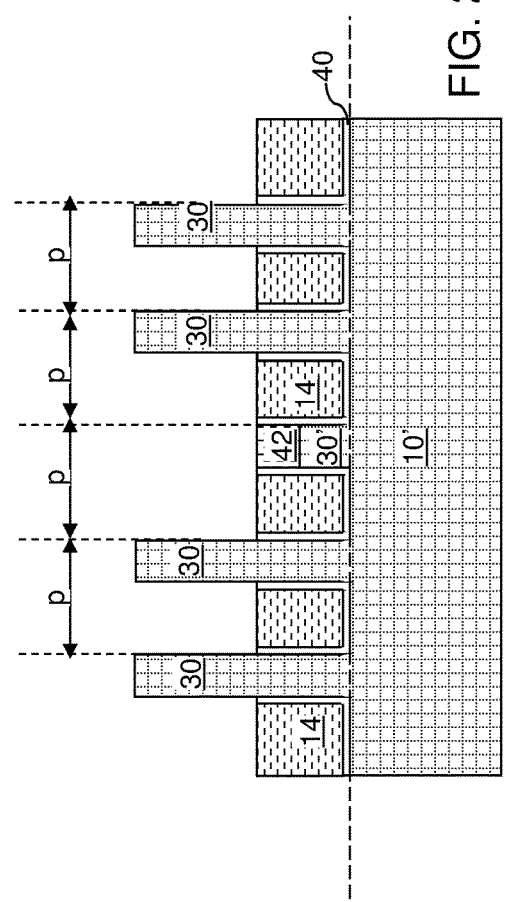
FIG. 21B is a vertical cross-sectional view of the fourth exemplary semiconductor structure along the vertical plane B-B' in FIG. 21A.

Referring to FIGS. 21A and 21B, the processing steps of FIGS. 17A and 17B can be performed to form a shallow trench isolation layer 14. Specifically, a dielectric material is deposited over the material liner 40 and the plurality of semiconductor fins 30. The dielectric material can be, for example, silicon oxide or silicon oxynitride. The dielectric material can be planarized, for example, by chemical mechanical planarization, and can be uniformed recessed so that the remaining portion of the dielectric material after the recess etch can have top surfaces that are substantially coplanar among one another. An upper portion of the dielectric material portion 42 can be etched during the recessing of the dielectric material so that the top surface of the remaining portion of the dielectric material portion 42 is recessed currently with the recessing of the dielectric material of the shallow trench isolation layer 14. A contiguous remaining portion of the dielectric material constitutes a shallow trench isolation layer 14. The dielectric material portion 42 can have the same composition as, or can have a different composition from, the shallow trench isolation layer 14. In one embodiment, the dielectric material portion 42 and the shallow trench isolation layer 14 can have the same composition, and the top surface of the dielectric material portion 42 can be coplanar with the top surface of the shallow trench isolation layer 14.

At least a region of the remaining portion of the material liner 40 can be removed selective to the plurality of semiconductor fins 30 by an etch process. In one embodiment, the portions of the material liner 40 that protrude above the top surface of the shallow trench isolation layer 14 can be removed by an isotropic etch. The same etch chemistry can be employed to remove the portions of the material liner 40 that protrude above the top surface of the shallow trench isolation layer 14 as in the processing steps of FIGS. 7A and 7B of the first embodiment of the present disclosure.

Referring to FIGS. 22A and 22B, a replacement gate structure (50, 52) can be formed in the same manner as in the first through third embodiments.

Referring to FIGS. 23A and 23B, a fifth exemplary semiconductor structure according to a fifth embodiment of the present disclosure can be derived from the third exemplary semiconductor structure of FIGS. 12A and 12B by forming a shallow trench isolation structure 14. The shallow trench isolation structure 14 can be formed by depositing a dielectric material over the material liner 40 and the plurality of semiconductor fins 30. The deposited dielectric material is different from the dielectric material of the material liner 14. For example, the material liner 14 can include silicon nitride, and the deposited dielectric material can be, for example, silicon oxide or silicon oxynitride. The dielectric material can be planarized, for example, by chemical mechanical planarization, and can be uniformed recessed so that the remaining portion of the dielectric material after the recess etch can have top surfaces that are substantially coplanar among one another. The remaining portion of the recessed dielectric material constitutes the shallow trench isolation layer 14.

Referring to FIGS. 24A and 24B, the processing steps of FIGS. 3A, 3B, 4A, and 4B are performed to form a compound material portion 41.

Figure 25A:
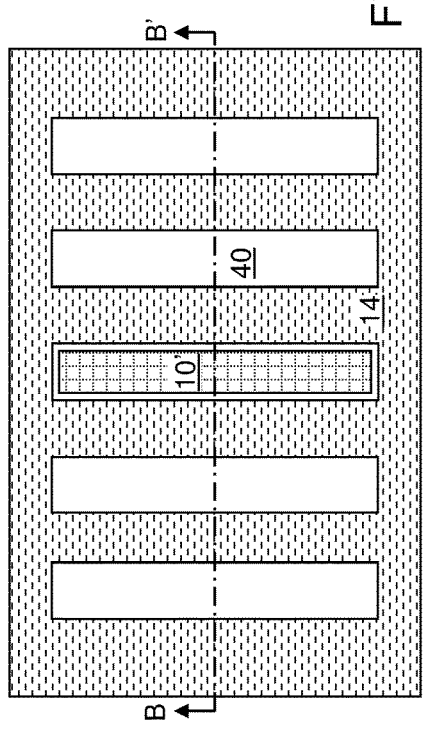
FIG. 25A is a top-down view of the fifth exemplary semiconductor structure after removal of the photoresist layer and the compound material portion and recessing of a semiconductor fin according to the fifth embodiment of the present disclosure.
Figure 25B:
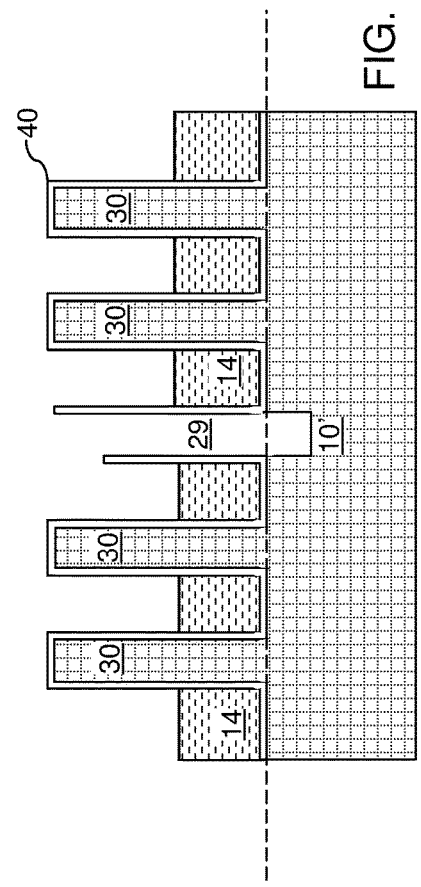
FIG. 25B is a vertical cross-sectional view of the fifth exemplary semiconductor structure along the vertical plane B-B' in FIG. 25A.

Referring to FIGS. 25A and 25B, the processing steps of FIGS. 15A, 15B, 16A, and 16B are performed to remove at least an upper portion of the physically exposed semiconductor fin 30. Specifically, the semiconductor material of the semiconductor fin 30 that is not covered by the remaining portions of the material layer 40 can be removed selective to the remaining portions of the material liner 40. In one embodiment, the semiconductor material of the semiconductor fin 30 can be removed selective to the material liner 40 and the shallow trench isolation structure 14. For example, a dry etch employing hydrochloric acid vapor can be employed to remove the semiconductor fin 30. The dry etch can be a reactive ion etch. The recess depth of the top surface of the etched semiconductor fin 30 or the portion of the substrate 10' underlying the etched semiconductor fin 30 (in case the semiconductor fin 30 is completely etched) can be selected as needed. In one embodiment, the etched semiconductor fin 30 can be completely removed, and a portion of the substrate 10' underlying the etched semiconductor fin can be recessed below a horizontal plane containing the topmost surface of the substrate 10'. A cavity 29 laterally surrounded by remaining portions of the material layer 40 can be formed by recessing the etched semiconductor fin 30 selective to the remaining portions of the material liner 40.

Subsequently, the processing steps of FIGS. 17A, 17B, 18A, and 18B can be performed. The fifth exemplary semiconductor structure after performing the processing steps of FIGS. 17A, 17B, 18A, and 18B can be the same as the third exemplary semiconductor structure illustrated in FIGS. 18A and 18B.

Figure 26A:
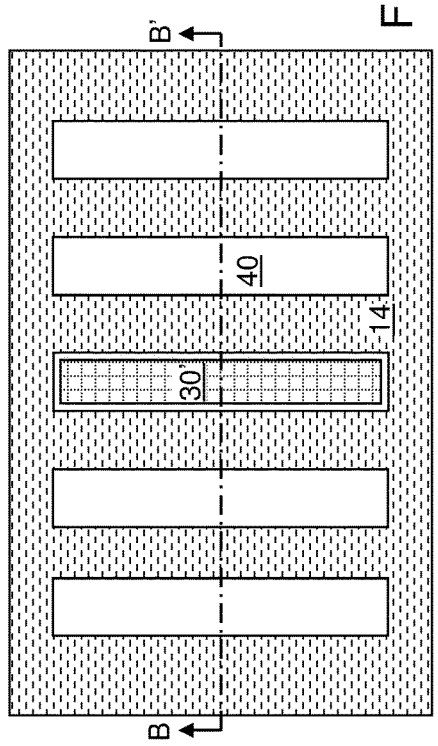
FIG. 26A is a top-down view of a variation of the fifth exemplary semiconductor structure after recessing of a semiconductor fin according to the fifth embodiment of the present disclosure.
Figure 26B:
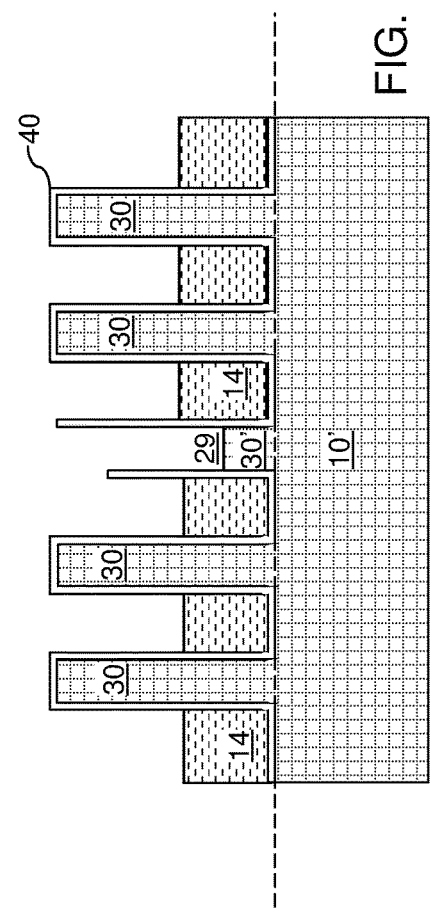
FIG. 26B is a vertical cross-sectional view of the fifth exemplary semiconductor structure along the vertical plane B-B' in FIG. 26A.

Referring to FIGS. 26A and 26B, a variation of the fifth exemplary semiconductor structure can be derived from the fifth exemplary semiconductor structure of FIGS. 24A and 24B by performing the processing steps of FIGS. 15A, 15B, 16A, and 16B such that a semiconductor material portion 30' is present above the horizontal plane including the top surface of the substrate 10' after etching an upper portion of the physically exposed semiconductor fin 30. The semiconductor material portion 30' is the remaining lower portion of the semiconductor fin 30. Subsequently, the processing steps of FIGS. 17A, 17B, 18A, and 18B can be performed. The variation of the fifth exemplary semiconductor structure after performing the processing steps of FIGS. 17A, 17B, 18A, and 18B can be the same as the variation of the third exemplary semiconductor structure illustrated in FIGS. 19A and 19B.

Figure 27A:
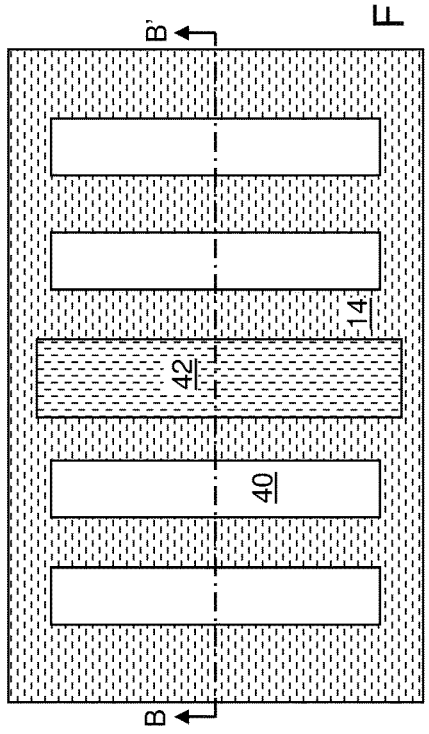
FIG. 27A is a top-down view of a sixth exemplary semiconductor structure after formation of a dielectric material portion according to a sixth embodiment of the present disclosure.
Figure 27B:
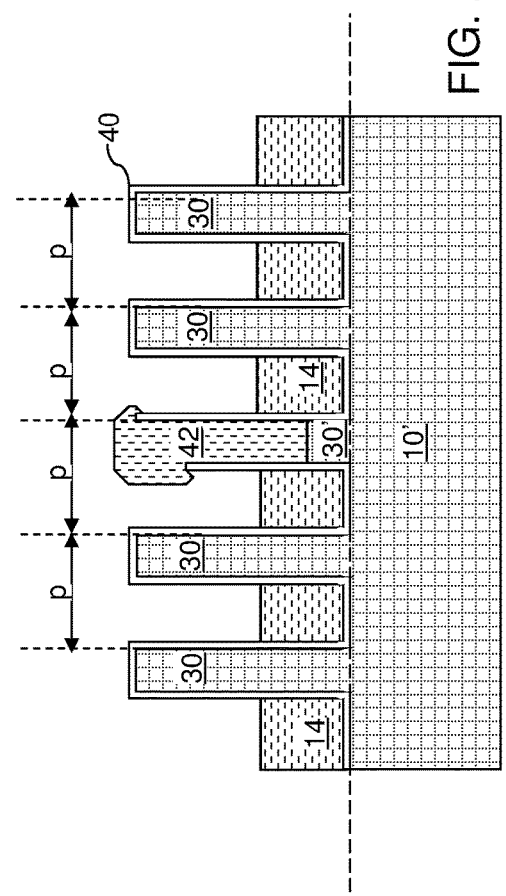
FIG. 27B is a vertical cross-sectional view of the sixth exemplary semiconductor structure along the vertical plane B-B' in FIG. 27A.

Referring to FIGS. 27A and 27B, a sixth exemplary semiconductor structure according to a sixth embodiment of the present disclosure can be derived from the third exemplary semiconductor structure of FIGS. 15A and 15B by converting at least a portion of the physically exposed semiconductor fin 30 into a dielectric material portion 42. The same conversion process can be employed as in the processing steps of FIGS. 9A and 9B. The dielectric material portion 42 has a greater width at an upper portion than at a lower portion.

Figure 28A:
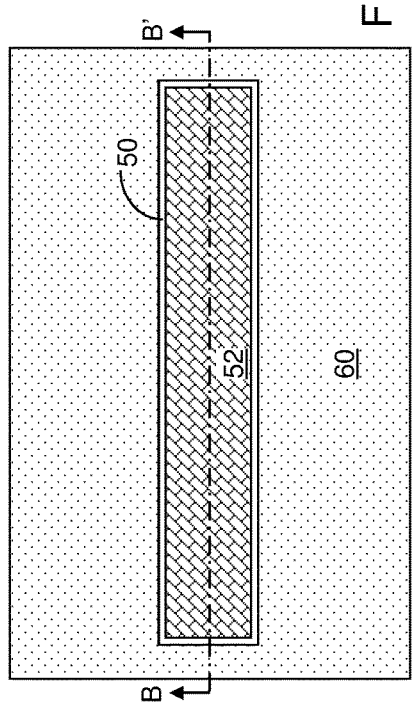
FIG. 28A is a top-down view of the sixth exemplary semiconductor structure after formation of a replacement gate structure according to the sixth embodiment of the present disclosure.
Figure 28B:
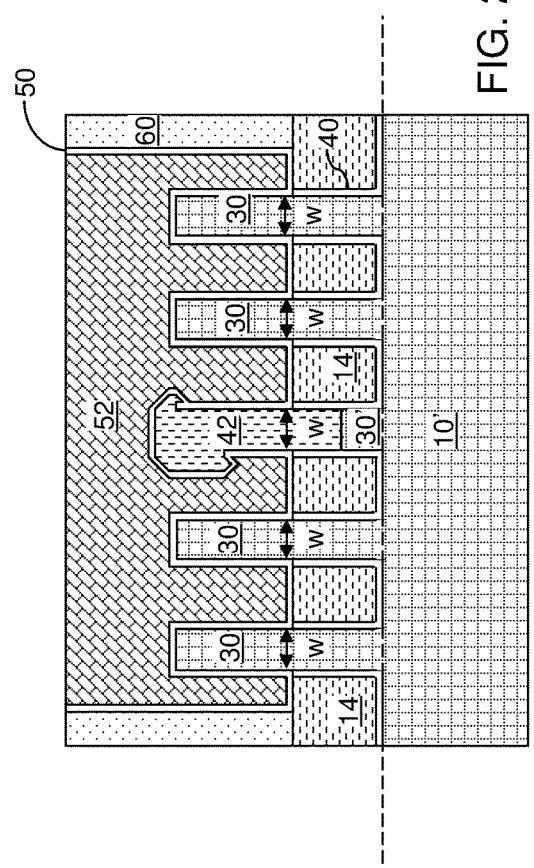
FIG. 28B is a vertical cross-sectional view of the sixth exemplary semiconductor structure along the vertical plane B-B' in FIG. 28A.

Referring to FIGS. 28A and 28B, the processing steps of FIGS. 10A, 10B, 11A, and 11B can be performed to form field effect transistors including a replacement gate structure (50, 52).

The various method of the present disclosure can remove a semiconductor fin 30 from among an array of a plurality of semiconductor fins 30 while minimizing lithographic limitations. According to prior art methods, the distance between two sidewalls of an opening of a photoresist layer patterned to cut out a single semiconductor fin in an array environment cannot exceed twice the pitch of the array less the width of the semiconductor fin to be cut less the overlay tolerance of the lithography process that patterns the photoresist layer. Due to use of the angled ion implantation to define the compound material portion 41, the sum of the first distance d1, the second distance d2, and the third distance d3 (See FIGS. 3B, 13B, and 24B) can be greater than twice the pitch p of the array of the semiconductor fins 30 less the width of the semiconductor fins 30 less the overlay tolerance of the lithography process employed to pattern the photoresist layer 27 of the present disclosure. Thus, through the use of the methods of the embodiments of the present disclosure, the probability is reduced for making an unintended cut through a semiconductor fin 30 that should be protected due to overlay variations of a lithography process to mask semiconductor fins to be protected. The various methods of the present disclosure provide novel ways of cutting semiconductor fins 30 in a tight pitch p. The fin cut process window can be significantly improved by the various methods of the present disclosure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
   forming a plurality of semiconductor fins on a substrate;
   forming a material liner on physically exposed surfaces of said plurality of semiconductor fins and said substrate;
   applying and patterning a photoresist layer over said material liner, wherein at least a semiconductor fin is positioned between a pair of sidewalls of said patterned photoresist layer;
   implanting an implant material into a top portion of said material liner employing an angled implantation process, wherein a first sidewall portion of said material liner located on one side of said semiconductor fin and a top portion of said material liner are converted into an compound material portion, and said implant material is not implanted into a second sidewall portion of said material liner located on another side of semiconductor fin;
   removing said compound material portion selective to remaining portions of said material liner that are not implanted with said implant material; and
   removing at least a portion of said semiconductor fin selective to said remaining portions of said material liner.

2. The method of claim 1, wherein said material liner comprises a dielectric material, a semiconductor material or a conductive material.

3. The method of claim 1, further comprising:
   forming a cavity by recessing said semiconductor fin selective to said remaining portions of said material liner; and
   forming a dielectric material portion in said cavity by depositing a dielectric material in said cavity.

4. The method of claim 3, further comprising forming a shallow trench isolation layer on a portion of said material liner, wherein a topmost surface of said dielectric material portion is coplanar with a top surface of said shallow trench isolation layer.

5. The method of claim 3, wherein said recessing said semiconductor fin completely removes said semiconductor fin and a portion of said substrate underlying said semiconductor fin, wherein a bottommost surface of said cavity is located beneath a topmost surface of said substrate.

6. The method of claim 5, wherein a bottom portion of said dielectric material portion is surrounded by said substrate.

7. The method of claim 3, wherein said recessing said semiconductor fin removes a portion of said semiconductor fin to provide a semiconductor material portion, wherein said dielectric material portion is located atop said semiconductor material portion and has a width the same as a width of said semiconductor material portion.

8. The method of claim 3, wherein said forming said plurality of semiconductor fins comprises:
   providing a bulk semiconductor substrate; and
   patterning a top portion of said bulk semiconductor substrate into said plurality of semiconductor fins, wherein an unpatterned bottom portion of said bulk semiconductor substrate constitutes said substrate, and said cavity is formed within said unpatterned bottom portion of said bulk semiconductor substrate.

9. The method of claim 1, further comprising etching at least a region of said remaining portion of said material liner selective to said plurality of semiconductor fins.

10. The method of claim 1, wherein said forming said plurality of semiconductor fins comprises:
    providing a semiconductor-on-insulator substrate comprising a vertical stack of a handle substrate, a buried insulator layer and a top semiconductor layer; and
    patterning the top semiconductor layer.

11. The method of claim 1, wherein said implant material comprises Rn, Xe, Kr, Ar or Ne.

12. The method of claim 1, wherein said implant material comprises Ge or Si.

13. The method of claim 1, wherein an angle of said angled implantation process is from 5 degrees to 45 degrees.

* * * * *